(12) United States Patent
Tam

(10) Patent No.: US 9,167,161 B1
(45) Date of Patent: Oct. 20, 2015

(54) CAMERA MODULE PACKAGE WITH A FOLDED SUBSTRATE AND LATERALLY POSITIONED COMPONENTS

(71) Applicant: Amazon Technologies, Inc., Reno, NV (US)

(72) Inventor: Samuel Waising Tam, Daly City, CA (US)

(73) Assignee: Amazon Technologies, Inc., Reno, NV (US)

( * ) Notice: Subject to any disclaimer, the term of this patent is extended or adjusted under 35 U.S.C. 154(b) by 28 days.

(21) Appl. No.: 14/109,491

(22) Filed: Dec. 17, 2013

Related U.S. Application Data

(60) Provisional application No. 61/872,475, filed on Aug. 30, 2013.

(51) Int. Cl.
*H04N 5/232* (2006.01)
*H04N 5/225* (2006.01)

(52) U.S. Cl.
CPC ......... *H04N 5/23248* (2013.01); *H04N 5/2252* (2013.01); *H04N 5/2253* (2013.01); *H04N 5/2254* (2013.01)

(58) Field of Classification Search
CPC ..................... H04N 5/2254; G02B 2207/125
USPC .................................. 348/340, 65; 296/268
See application file for complete search history.

(56) References Cited

U.S. PATENT DOCUMENTS

| | | | |
|---|---|---|---|
| 7,230,777 B2 | 6/2007 | Ye | |
| 7,525,096 B2 | 4/2009 | Nakajo et al. | |
| 7,555,211 B2 * | 6/2009 | Go | 396/268 |
| 7,570,297 B2 | 8/2009 | Maeda et al. | |
| 7,633,543 B2 | 12/2009 | Shinomiya | |
| 7,884,875 B2 | 2/2011 | Kwon et al. | |
| 7,948,555 B2 | 5/2011 | Kwon et al. | |
| 8,009,971 B2 | 8/2011 | Koo et al. | |
| 8,089,694 B2 | 1/2012 | Wernersson | |
| 8,092,102 B2 | 1/2012 | Shangguan et al. | |
| 8,149,321 B2 | 4/2012 | Ryu et al. | |
| 8,170,408 B2 | 5/2012 | Nasiri et al. | |
| 8,174,583 B2 | 5/2012 | Ko et al. | |
| 8,223,249 B2 | 7/2012 | Chang | |
| 8,248,514 B1 | 8/2012 | Chang | |
| 8,248,523 B2 | 8/2012 | Chua et al. | |

(Continued)

FOREIGN PATENT DOCUMENTS

WO    WO2012038703 A2    3/2012

OTHER PUBLICATIONS

Chowdhury, et al., "Challenges of Megapixel Camera Module Assembly and Test" Proceedings of 2005 Electronic Components and Technology Conference, pp. 1390-1401.

(Continued)

*Primary Examiner* — Tuan Ho
(74) *Attorney, Agent, or Firm* — K&L Gates LLP

(57) ABSTRACT

Systems and methods of manufacturing compact camera modules for use in electronic device are provided. The camera module includes a lens housing and a flexible substrate. An image sensor die is coupled to a first portion of the flexible substrate, and a second portion of the substrate is folded so as to position optical image stabilization components adjacent to a lateral side of the lens housing. The optical image stabilization components may be enclosed within a molded enclosure.

21 Claims, 27 Drawing Sheets

(56) References Cited

U.S. PATENT DOCUMENTS

| | | |
|---|---|---|
| 8,405,756 B2 | 3/2013 | Yano et al. |
| 8,430,579 B2 | 4/2013 | Tam et al. |
| 2002/0167081 A1 | 11/2002 | Kondo |
| 2004/0115866 A1 | 6/2004 | Bang et al. |
| 2004/0212719 A1 | 10/2004 | Ikeda |
| 2005/0024752 A1 | 2/2005 | Webster |
| 2008/0170141 A1 | 7/2008 | Tam et al. |
| 2008/0252771 A1 | 10/2008 | Wu |
| 2009/0190025 A1 | 7/2009 | Lu |
| 2010/0053423 A1 | 3/2010 | Singh |
| 2011/0075999 A1 | 3/2011 | Chiu |
| 2011/0102667 A1 | 5/2011 | Chua et al. |
| 2011/0122267 A1 | 5/2011 | Ahn et al. |
| 2011/0150462 A1 | 6/2011 | Chiu et al. |
| 2011/0194014 A1* | 8/2011 | Ozaki ............................ 348/340 |
| 2011/0194023 A1 | 8/2011 | Tam et al. |
| 2011/0262121 A1 | 10/2011 | Yanagisawa et al. |
| 2011/0267535 A1 | 11/2011 | Seo et al. |
| 2012/0242883 A1 | 9/2012 | Pavithran et al. |
| 2012/0276951 A1 | 11/2012 | Webster et al. |
| 2012/0312976 A1 | 12/2012 | Boulanger et al. |
| 2013/0050571 A1 | 2/2013 | Tam |
| 2013/0107068 A1 | 5/2013 | Kim et al. |
| 2013/0128106 A1 | 5/2013 | Tam et al. |

OTHER PUBLICATIONS

Non-Final Office Action dated Jan. 30, 2015 in U.S. Appl. No. 14/109,502, filed Dec. 17, 2013.

* cited by examiner

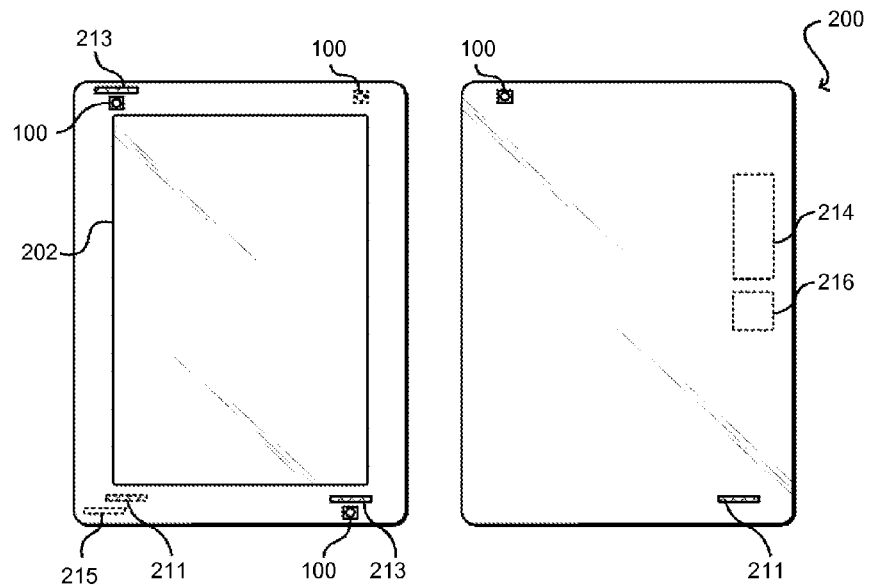
FIG. 2A  FIG. 2B
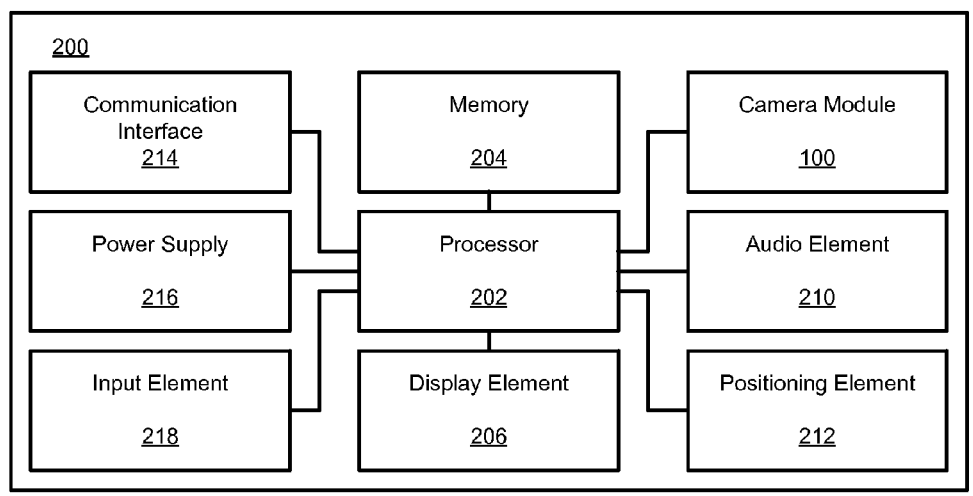
FIG. 3

CAMERA MODULE PACKAGE WITH A FOLDED SUBSTRATE AND LATERALLY POSITIONED COMPONENTS

CROSS-REFERENCE TO RELATED APPLICATIONS

This application claims the benefit of U.S. Provisional Application No. 61/872,475, filed Aug. 30, 2013, the disclosure of which is incorporated herein by reference in its entirety.

BACKGROUND

Digital camera functionality is being incorporated into a wide variety of electronic devices. In particular, there is an increased demand by consumers for high quality photographic capability in consumer electronics and mobile computing devices, such as mobile phones, smartphones, and tablet computers. However, there is also high demand for mobile computing devices with increasingly small form factors, with extremely thin devices being particularly desirable for both aesthetics and portability. In addition, there is an ongoing desire to improve quality and functionality while decreasing the cost of components and manufacturing.

One common problem experienced by photographers is blurry images caused by the shaking of the camera during image capture. Image stabilization technology has been developed to reduce the amount of blurring associated with the movement of the camera. One common approach is optical image stabilization, which utilizes gyro-sensors to detect the angular velocity of the camera. The lens or image sensor is moved in response to this detection, to stabilize the recorded image by varying the optical path to the image sensor. Unfortunately, the various components used to perform image stabilization can consume an undesirably large amount of space inside of the electronic device's housing.

Accordingly, there is a need for improved camera module designs and manufacturing processes for incorporation into electronic devices.

BRIEF DESCRIPTION OF DRAWINGS

FIGS. 2A-2B illustrate front and back views, respectively, of an example portable computing device that may incorporate a camera module in accordance with embodiments of the present invention.

FIG. 3 is an example block diagram illustrating basic components of a computing device, in accordance with embodiments of the present invention.

DETAILED DESCRIPTION

In the following description, reference is made to the accompanying drawings which illustrate several embodiments of the present invention. It is understood that other embodiments may be utilized and mechanical, compositional, structural, and electrical operational changes may be made without departing from the spirit and scope of the present disclosure. The following detailed description is not to be taken in a limiting sense, and the scope of the embodiments of the present invention is defined only by the claims of the issued patent.

Systems and methods in accordance with various embodiments of the present disclosure provide improved manufacturing methods and camera module designs that are compact, inexpensive to manufacture, and reliable in operation. These designs may provide small form factor autofocus (AF) camera modules for incorporation into thin mobile devices, such as tablets or smartphones. In accordance with some embodiments, a camera module includes a lens housing and a flexible substrate. An image sensor die is coupled to a first portion of the flexible substrate, and a second portion of the substrate is folded so as to position optical image stabilization components adjacent to a lateral side of the lens housing. The optical image stabilization components may be encapsulated within a molded enclosure. The resulting camera module can achieve a compact footprint with low manufacturing costs.

Figure 1:
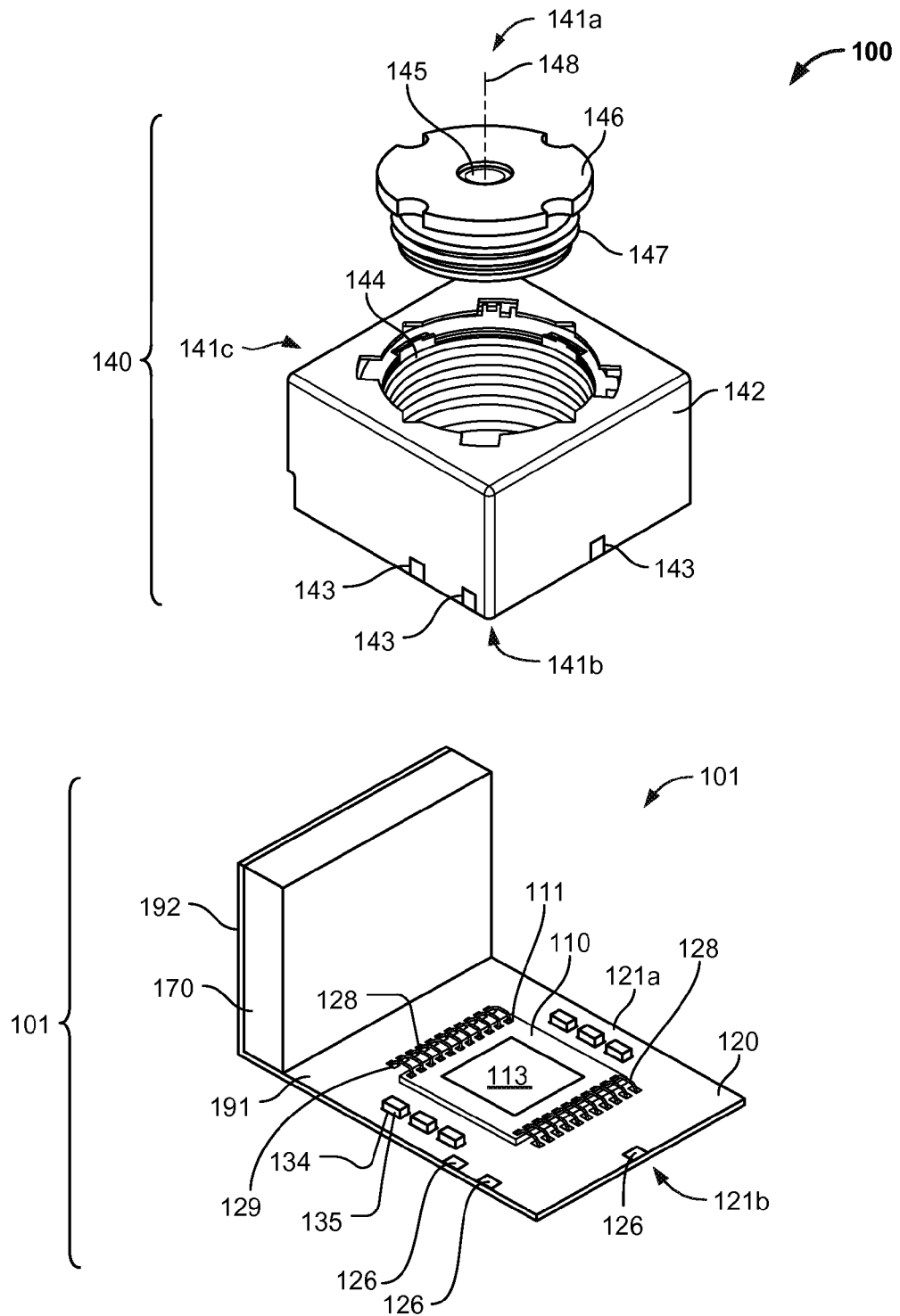
FIG. 1 is an exploded perspective view of a camera module with a folded substrate and laterally positioned components, in accordance with embodiments of the present invention.
Figure 4:
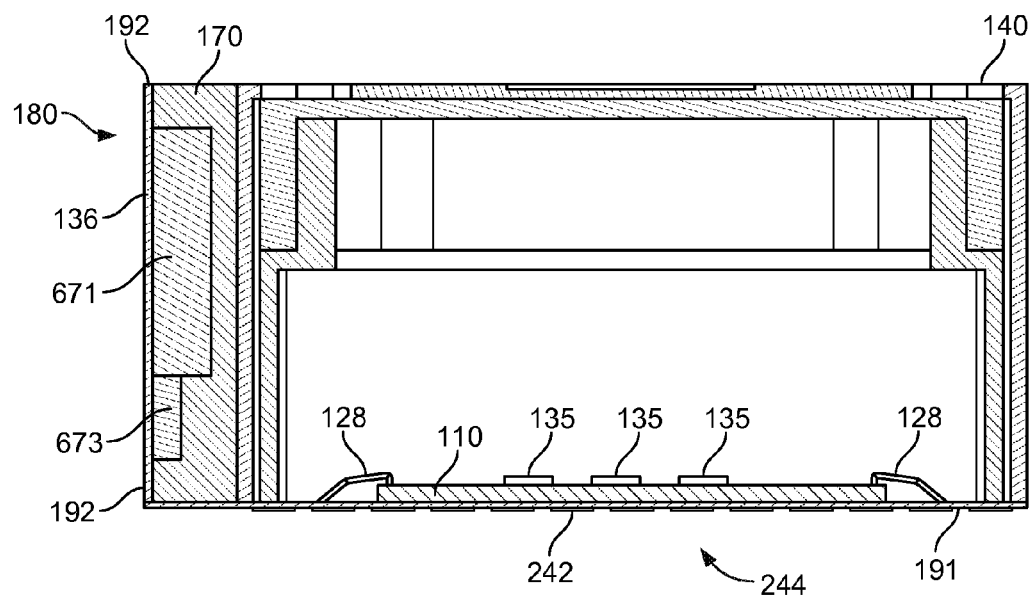
FIG. 4 is a cross-sectional view of a camera module, in accordance with embodiments of the present invention.

FIG. 1 is an exploded perspective view of a camera module 100 with an image sensor die positioned on a first portion 191 of a flexible substrate 120, and a second portion 192 of the substrate 120 folded so as to position optical image stabilization components adjacent to the lateral side 141c of the lens housing 142, in accordance with embodiments of the present invention. FIG. 4 is a cross-sectional view of the camera module 100.

The camera module 100 comprises an image sensor module 101 and a lens module 140. The image sensor module 101 comprises an image sensor 110, an optical filter (not shown), a substrate 120, and electronic components 135.

The lens module 140 comprises an autofocus lens housing 142 forming a cavity containing one or more lenses 145 which are supported by a lens barrel 146. The lens barrel 146 includes a threaded section 147 and is received in a corresponding lens barrel 144, which is driven by motors or actuators in the lens housing 120 to rotate, thereby translating the lens barrel 146 up and down along optical axis 148. The lens module 140 may utilize voice coil motors (VCM) to move the lens barrel 146 along the optical axis 148 of the camera. The VCM may also drive lateral movement of the lens barrel 146 orthogonal to the optical axis 148 in order to provide optical image stabilization to compensate for shaking or other movement of the camera. Alternatively, microelectromechanical systems (MEMS) actuators may be used to translate the lenses 145. A variety of camera modules, including a variety of multi-lens autofocus camera modules, are commercially available and may be utilized in accordance with various embodiments of the present invention.

The lens module 140 comprises an image receiving side 141a, an image sensor side 141b, and a lateral side 141c. The image receiving side 141a faces the object being photographed when the camera module 100 is in use. The image sensor side 141b faces the image sensor 110.

The substrate 120 may comprise any form of circuit substrate suitable to provide the necessary interconnection structure for operation of the camera module 100, as is well known in the art. The substrate 120 may comprise, for example, a flexible substrate, such as a flexible high density interconnect (HDI) tape substrate, which is available in very thin configurations. The HDI tape substrate may comprise a multilayer interconnect structure using polyimide as a dielectric and electroplated copper conductor lines, The flexible substrate 120 may comprise a flexible base material comprising, e.g., polyester, polyimide, polyethylene naphthalate, or polyetherimide, and conductive layers comprising, e.g., conductive metal foil, electroplated copper, screen printed metal circuits, or other conductive materials. Alternatively, the flexible substrate 120 may comprise a rigid flex substrate having one or more interconnect and dielectric layers.

The flexible substrate 120 comprises a first portion 191 which is positioned adjacent to the image sensor side 141b of the lens module 140, and a second portion 192 which is positioned adjacent to the lateral side 141c of the lens module 140. The first portion 191 includes a plurality of substrate-sensor contacts 129. The image sensor die 110 includes a plurality of output die contacts 111 formed along one or more edges of the image sensor die 110. The output die contacts 111 are coupled to the substrate-sensor contacts 129, as will be described in greater detail below.

In the illustrated embodiment, the first portion 191 of the substrate 120 includes a plurality of component contacts 134 for coupling with the electronic components 135. The electronic components 135 may include passive and/or active components for processing the output signals from the image sensor. The passive components may include inductors, capacitors, or resistors. The electronic components 135 are coupled to the component contacts 134 formed on the substrate 120, thereby electrically coupling the passive components 135 with the image sensor die 110 via the substrate-sensor contacts 129. The second portion 192 of the substrate 120 includes a second plurality of component contacts 136 for coupling with the image stabilization components 180, as will be described in greater detail below.

The lower side 121b of the flexible substrate 120 further includes a main board contact region 244. The main board contact region 244 includes a plurality of LGA pads 242 which may be coupled to main board contacts on the main board of the electronic device. The LGA pads 242 receive all of the power and I/O signals required for operation of the camera module 100. The LGA pads 242 can be bonded (e.g., soldered) directly to corresponding contacts on the main board, coupled to an LGA socket mounted to the main board, or coupled to another intermediate interposer structure, such as a cable or circuit board, which is coupled to the main board.

The image sensor die 110 includes a photosensor portion 113 comprising any type of image capturing element that converts an optical image into an electronic signal, such as a charge-coupled device (CCD) or complementary metal-oxide-semiconductor (CMOS) active pixel sensor.

An optical filter (not shown) may be used to improve the quality of the images generated by the camera module. The optical filter may be used for filtering undesirable wavelengths of light, such as infrared light, received by the lens module 140 to prevent the light from reaching the photosensor portion 113 of the image sensor die 110, which could degrade the quality of digital image generated. In other embodiments, other types of optical filters may be used, such as, for example, a blue or other color filter, or a polarizing filter. The optical filter may be positioned in a variety of locations within the camera module 100. For instance, a spacer member may be coupled to the upper side 121a of the flexible substrate 120 surrounding the image sensor die 110. The spacer member may be used to support the optical filter above the image sensor die 110 and bond wires 128 coupling the image sensor die 110 to the flexible substrate 120. In other embodiments, the optical filter may be coupled to the lens housing 142.

The camera module 100 may be incorporated into any of a variety of electronic devices. FIGS. 2A-2B illustrate front and back views, respectively, of an example portable computing device 200 that may incorporate a camera module in accordance with various embodiments described herein. Although one example of an electronic device is shown, it should be understood that various other types of electronic devices that are capable of incorporating digital camera functionality can be used in accordance with various embodiments discussed herein. The electronic devices can include, for example, smartphones, electronic book readers, tablet computers, notebook computers, personal data assistants, cellular phones, video gaming consoles or controllers, television set top boxes, and portable media players, among others.

In this example, the portable computing device 200 has a display 202 (e.g., a liquid crystal display (LCD) element) operable to display image content to one or more users or viewers of the device. In at least some embodiments, the display screen provides for touch or swipe-based input using, for example, capacitive or resistive touch technology.

FIG. 3 is an example block diagram illustrating basic components of a computing device, such as computing device 200. In this example, the device 200 includes at least one processor 202 for executing instructions that can be stored in at least one memory device 204. As would be apparent to one of ordinary skill in the art, the memory device 204 can include one or more different types of memory, data storage or computer-readable storage media, such as, for example, a first data storage for program instructions for execution by the processor 202, a second data storage for images or data and/or a removable storage for transferring data to other devices.

The computing device 200 includes one or more camera modules 100 configured to capture an image of people or objects in the vicinity of the device 200. The computing device 200 may include a main board, which may be the primary circuit board for the computing device 200 onto which one or more of the following components may be mounted. The camera module 100 includes a circuit substrate 120 which may be electrically coupled to the main board of the computing device 200 in a variety of ways, such as by direct mounting to the main board or with an interposer, which serves as an intermediate coupling device providing an electrical interface between the circuit substrate 120 and the main board. The interposer may comprise, for example, a cable or a rigid or flexible circuit board having interfaces coupled to the circuit substrate 120 and the main board, as will be described in greater detail below.

The computing device 200 includes a display element 206 for displaying images using technologies such as, for example, electronic ink (e-ink), organic light emitting diode (OLED) or liquid crystal display (LCD). The computing device 200 may also include an audio element 210, such as one or more audio speakers 211 and/or audio capture elements capable of capturing audio data, such as microphones 213. The computing device 100 may also include a positioning element 212, such as motion, position or orientation determining element 215, that provides information such as a position, direction, motion, or orientation of the device 200. The computing device 200 can include one or more input elements 218 operable to receive inputs from a user. The input elements 218 can include, for example, a push button, touch pad, touch screen, wheel, joystick, keyboard, mouse, trackball, keypad or any other such device or element whereby a user can provide inputs to the computing device 200. The computing device 200 may also include at least one communication interface 214, comprising one or more wireless components operable to communicate with one or more separate devices within a communication range of the particular wireless protocol. The wireless protocol can be any appropriate protocol used to enable devices to communicate wirelessly, such as Bluetooth, cellular, or IEEE 802.11. It should be understood that the computing device 200 may also include one or more wired communications interfaces for coupling and communicating with other devices. The computing device 200 may also include a power supply 216, such as, for example, a rechargeable battery operable to be recharged through conventional plug-in approaches, or through other approaches such as capacitive charging.

Figure 5:
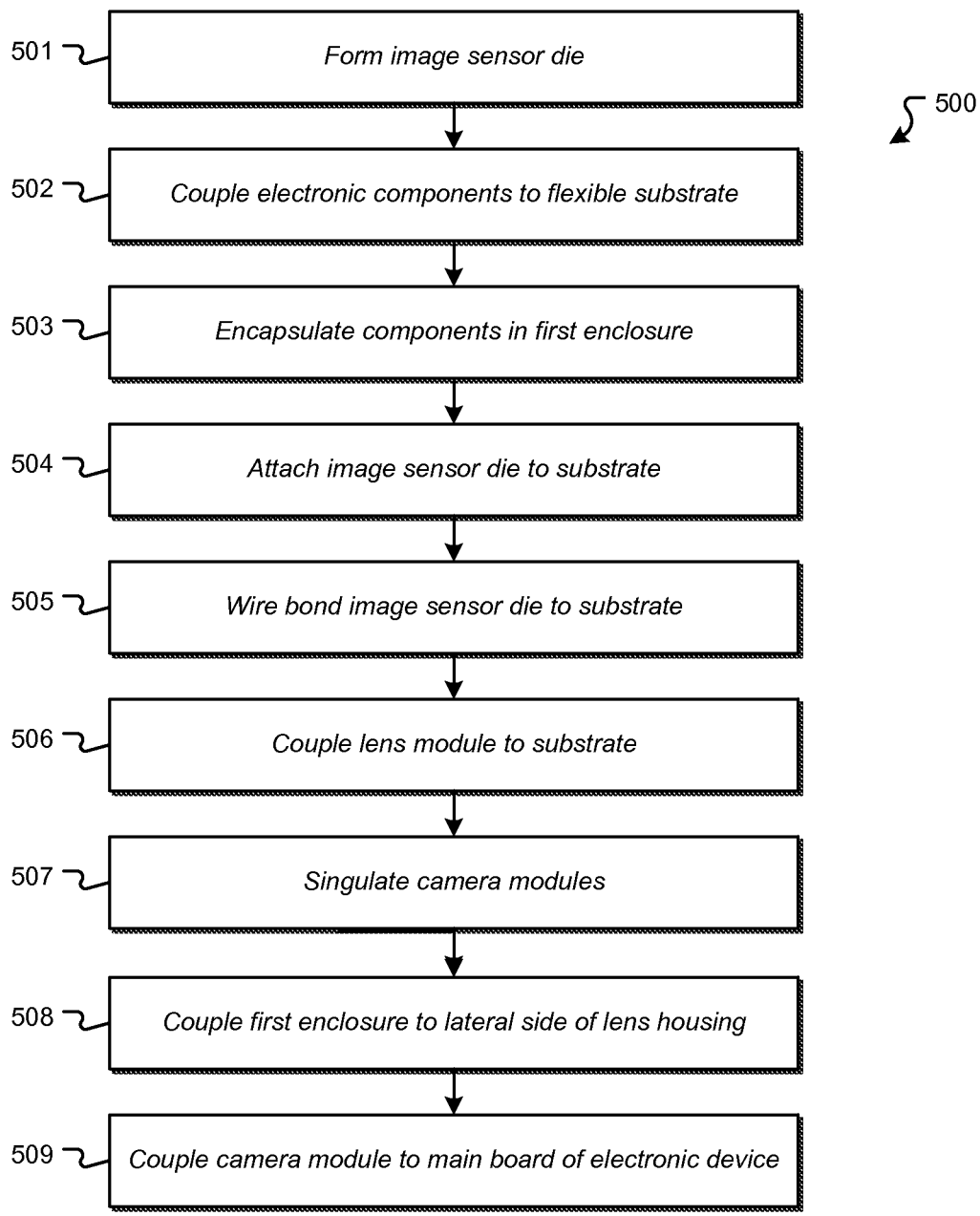
FIG. 5 is a flowchart illustrating a method of manufacturing a camera assembly with a folded substrate and laterally positioned components, in accordance with embodiments of the present invention.

FIG. 5 is a flowchart illustrating a method 500 of manufacturing a camera assembly 100 with an image sensor die 110 coupled to a first portion 191 of the flexible substrate 120, and a second portion 192 of the substrate 120 folded so as to position optical image stabilization components adjacent to the lateral side 141c of the lens housing 142, in accordance with embodiments of the present invention. FIGS. 6A-6H illustrate various steps in the manufacturing method 500.

Figure 6A:
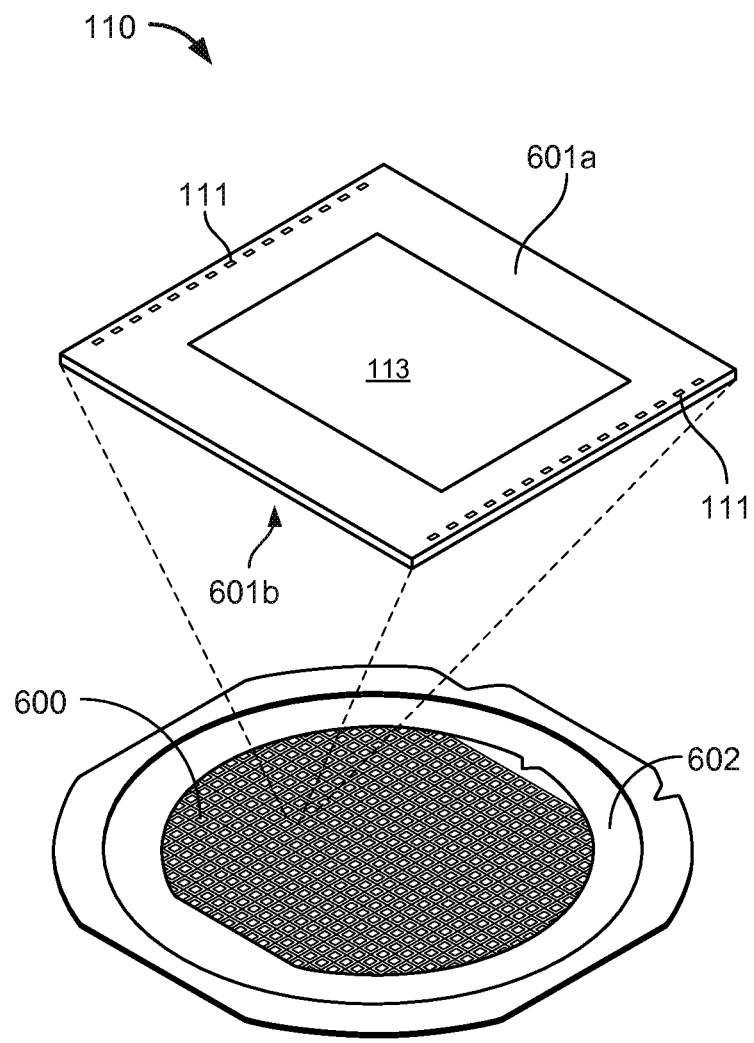
FIGS. 6A-6G illustrate various steps in the manufacturing process illustrated in FIG. 5.

In step 501, shown in FIG. 6A, the image sensor die 110 is formed. Before each image sensor die 110 is singulated or diced from the wafer 600 held in the wafer carrier 602, a plurality of die contacts 111 are formed on the upper surface 601a of each image sensor die 110. The die contacts 111 can be formed in a variety of ways, depending on the desired method of coupling the image sensor die 110 to the substrate 120. In some embodiments, the die contacts 111 on the image sensor die 110 may be used for wire bonding with the substrate 120. The die contacts 111 may be formed using any of a variety of well-known techniques, such as, for example, using ball bonds.

Figure 6B:
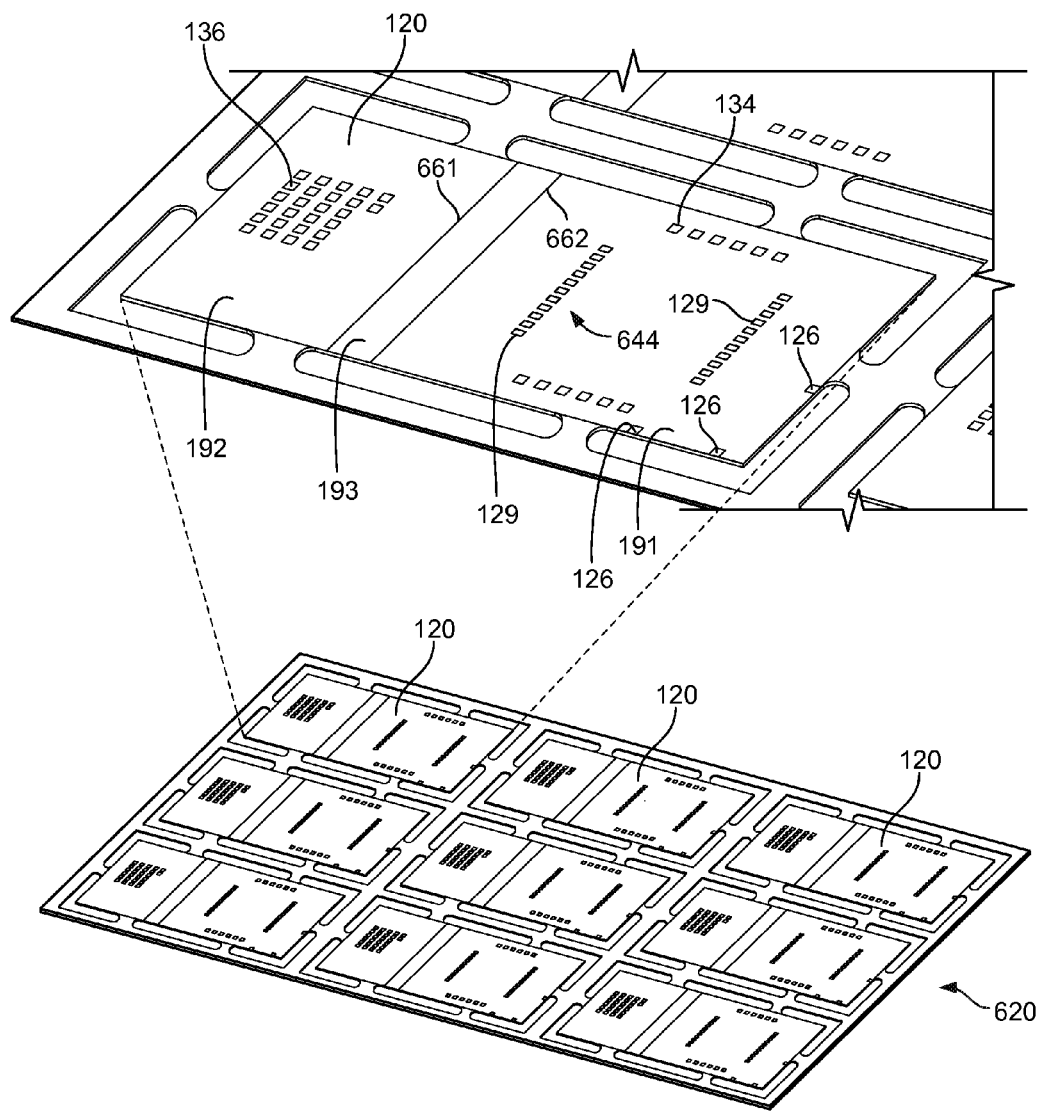
Figure 6C:
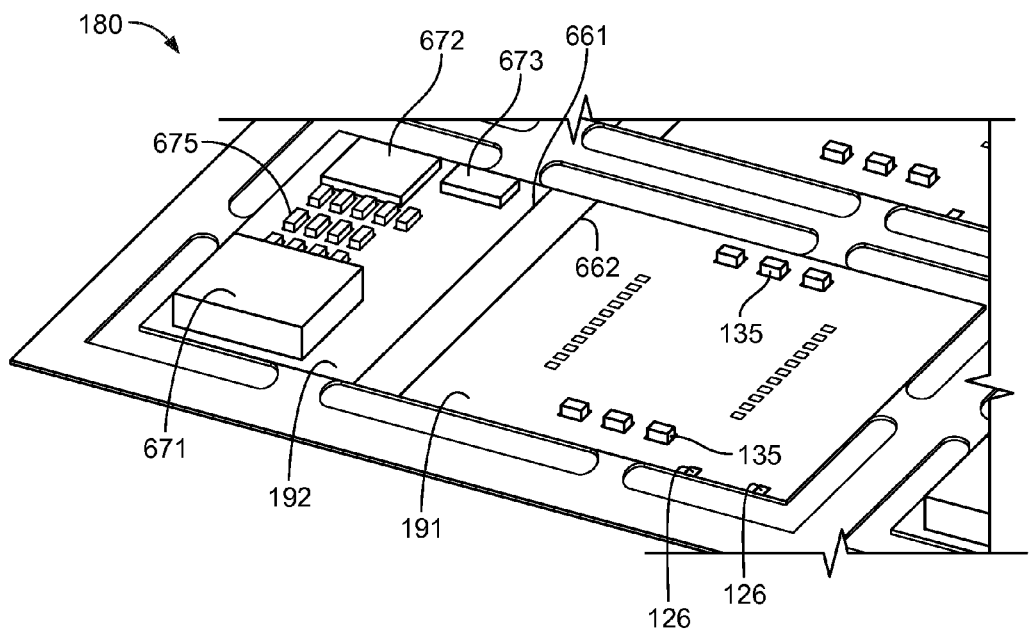

In step 502, shown in FIGS. 6B-6C, a plurality of substrates 120 are provided in a substrate strip array 620 and the electronic components 135 are coupled to the substrate 120. Lines 661, 662 are shown for illustrative purposes and do not necessarily indicate the presence of physical features in the substrate 120. Fold line 661 indicates where the substrate 120 will be folded when coupled to the lens module 140, as will be described in greater detail below. Margin line 662 indicates the border of the first portion 191 of the substrate 120, which is positioned adjacent to the image sensor side 141b of the lens module 140 in the completed camera assembly 100. In some embodiments, fold line 661 corresponds to mechanical features in the substrate 120 for facilitating the folding of the substrate 120. In other embodiments, the fold line 661 does not represent any physical features and is merely illustrative of the location of a later folding step.

FIG. 6B shows the upper side 121a of each substrate 120, which includes a plurality of component contacts 134. Electronic components 135 (shown in FIG. 6C) may be coupled to each of these contacts 134 using surface mount technology (SMT). A plurality of lens module connections 126 may be provided along the outer edges of the substrate 120 for coupling with corresponding contacts 143 (shown in FIG. 1) in the lens housing 142. These lens module connections 126 may be used to provide power, ground, and control signals to the lens module 140. The various contacts provided on the substrate 120 may be formed, e.g., using electroless nickel immersion gold (ENIG) plating techniques. ENIG is an electroless nickel layer capped with a thin layer of immersion gold, which provides a multifunctional surface finish. The immersion gold protects the underlying nickel from oxidation/passivation.

The components mounted to the second portion 192 of the substrate 120 may comprise image stabilization components 180 used to provide an optical image stabilization (OIS) functionality for the camera module 100. These image stabilization components 180 may comprise, for example, a gyroscopic sensor 671, a memory 672, an optical image stabilization logic module 673, and passive electronic components 675. The gyroscopic sensor 671 may comprise one or more sensors for sensing movement along one or more axes. In some embodiments, the gyroscopic sensor 671 may sense movement along two axes, thereby enabling correction for pitch and yaw axis rotations. The memory 672 may comprise a non-volatile EPROM memory for storing the firmware instructions for the operation of the OIS functionality. The optical image stabilization logic module 673 may comprise a controller with logic for executing the OIS functionality. The image stabilization components 180 may be mounted to the substrate 120 using any suitable manufacturing technique, such as the SMT mounting process described above.

In accordance with some embodiments of the present invention, the electronic components 135 on the first portion 191 of the substrate 120 comprise decoupling capacitors that are coupled to the substrate 120 along the two sides of the image sensor die 110 not used for wire bonding of the die 110 to the substrate 120. As a result, the decoupling capacitor passive components 135 may be placed as close as possible to the image sensor die 110, thereby improving the image signal from the die 110. Other passive components 675 that do not require close proximity to the image sensor die 110 or that require close proximity to the other image stabilization components 180, such as the gyroscopic sensor 671 and optical image stabilization logic module 673, may be coupled to the second portion 192 of the substrate 120.

Figure 6D:
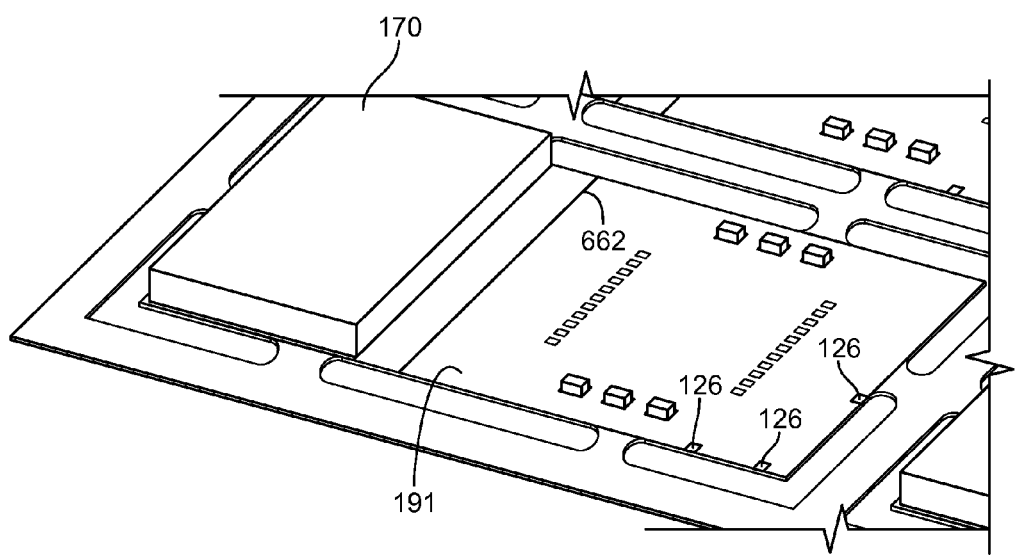

In step 503, shown in FIG. 6D, the image stabilization components 180 are encapsulated in an enclosure 170. In some embodiments, the enclosure 170 comprises any of a variety of transfer molding materials well-known in the semiconductor packaging industry. The transfer molding material may comprise a resin with a hardener, accelerator, fillers, flame retardants, and other modifiers, such as an epoxy resin with a silica filler. In the illustrated embodiment, the molded enclosure 170 serves to protect the image stabilization components 180 and to provide a flat surface for bonding with the lateral side 141c of the lens housing 140. The transfer molding material can be advantageous in this application because its manufacturing processes are well known and relatively inexpensive, and its physical characteristics are well documented. In other embodiments, the enclosure 170 may comprise another material. A rigid enclosure 170 comprising, e.g., a metal or polymer, may be formed prior to attachment to the substrate 120, and may be attached to the substrate 120 to enclose the image stabilization components 180. In some embodiments, a grounded metal enclosure 170 may advantageously provide RF shielding and isolation for the electronic components contained therein.

Figure 6E:
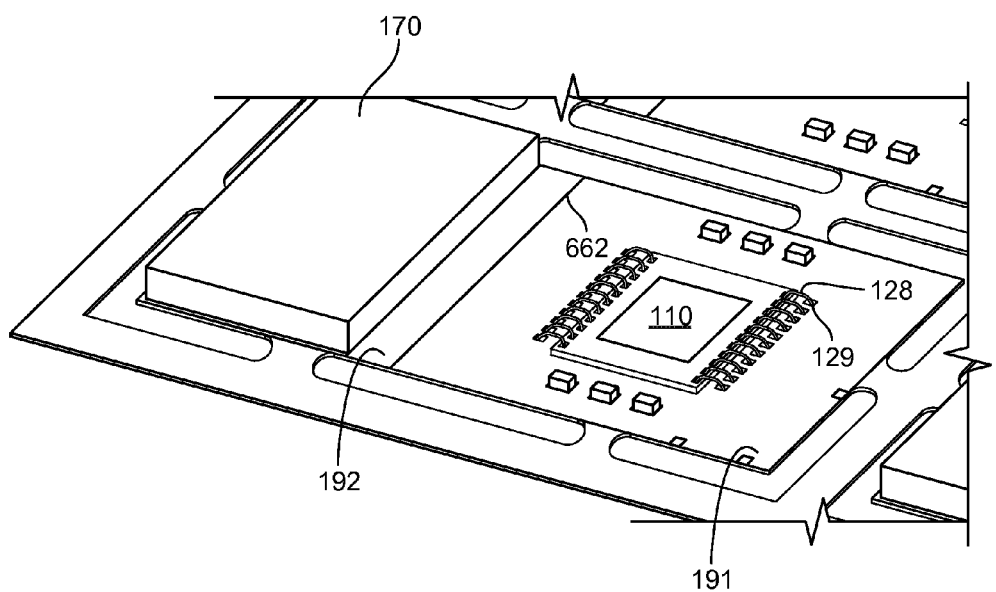

In step 504, shown in FIG. 6E, the image sensor die 110 is attached to the substrate 120, using, for example, an epoxy adhesive.

In step 505, the die contacts 111 on the upper surface of each image sensor die 110 are wire bonded to substrate-sensor contacts 129 on the upper surface of the flexible substrate 120. Each of the die contacts 111 is coupled to a respective one of the substrate-sensor contacts 129 using a bond wire 128, e.g., a gold bond wire, which extends from the flexible substrate 120 to the image sensor die 110.

Figure 6F:
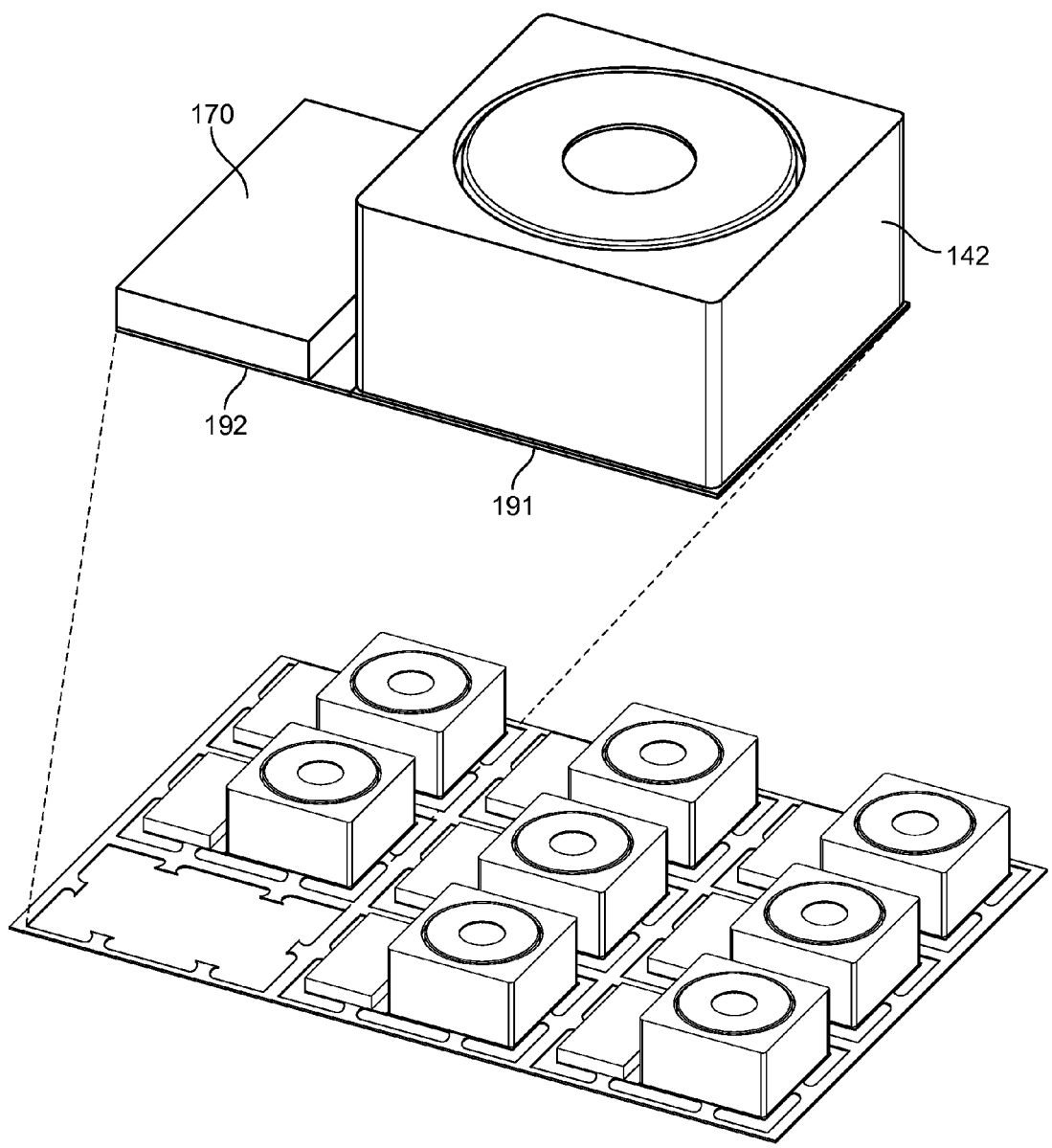

In step 506, shown in FIG. 6F, a lens housing 142 is coupled to each of the substrate assemblies 120 in the substrate strip array 620. The lens housing 142 may be attached to the substrate 120 by depositing an adhesive, such as an epoxy adhesive, onto a portion of the substrate 120 not otherwise used for electrical connections. The lens module connections (not shown) on the substrate 120 may then be coupled to the corresponding contacts (not shown) in the lens housing 142 using, for example, conventional soldering methods.

Figures 6G, 7A, 7B:
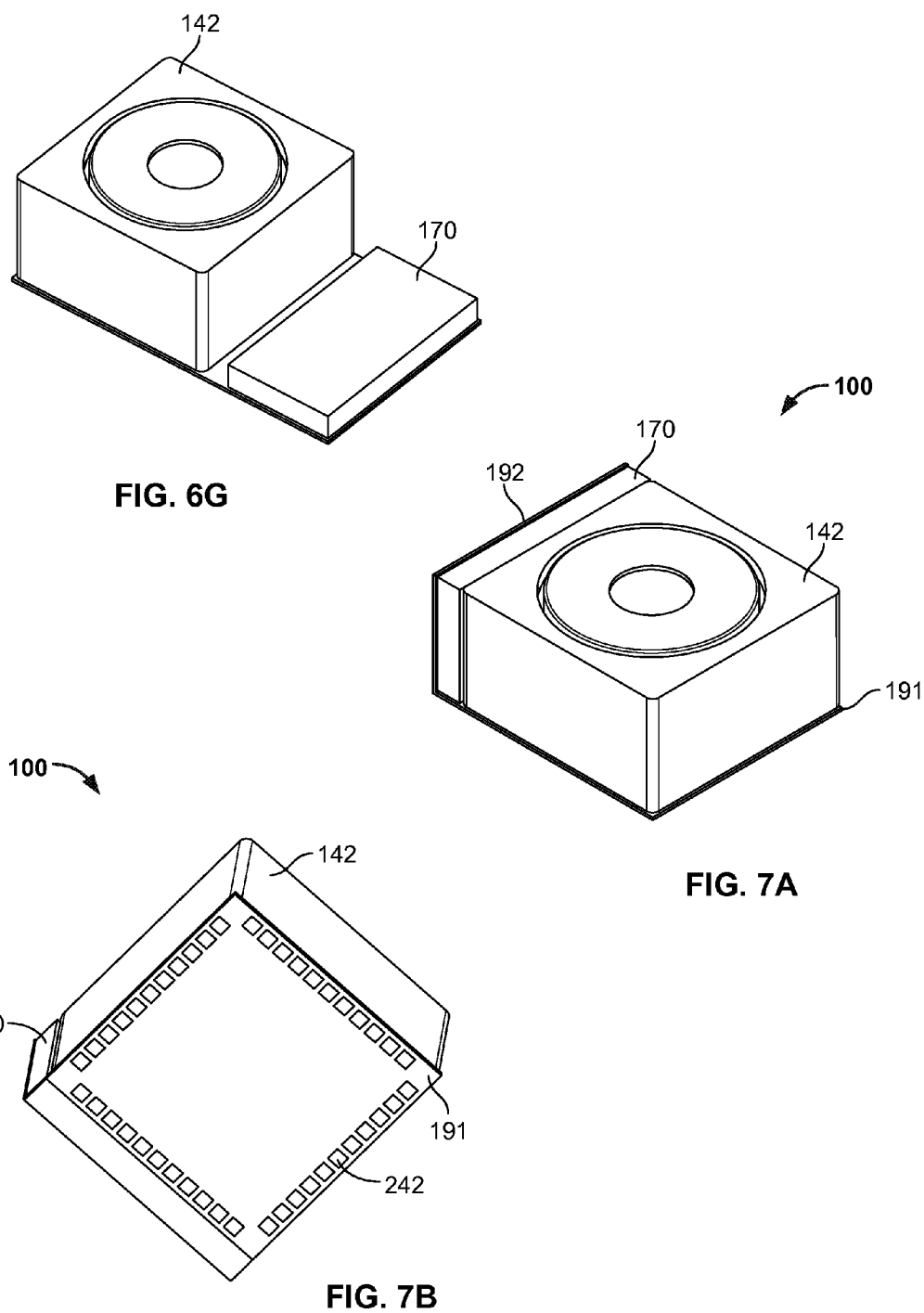
FIGS. 7A-7B illustrate perspective views of a camera module, in accordance with embodiments of the present invention.

In step 507, shown in FIG. 6G, each camera module 100 may then be singulated from the strip array 620 for integration with an electronic device, such as computing device 200. In some embodiments, the substrate assemblies 120 may be singulated from the strip array 620 prior to attachment of the lens housings 142. However, in other embodiments, it is desirable to attach the lens housings 142 to each of the substrates 120 prior to singulation from the array 620. This bulk processing can result in an improvement in the manufacturing units per hour (UPH). In addition, after the lens housings 142 are attached, the strip array 620 may be coupled to a test fixture which establishes electrical connections with each of the camera modules 100 in the array 620. This can enable the test fixture to power up and test each of the camera modules 100 prior to singulation. During this testing, an active alignment process may be performed to ensure that the optical path through the lenses 145 is accurately aligned with the image sensor die 110. The active alignment process can measure the optical characteristics of the lenses 145 and image sensor die 110 and adjust the alignment in up to five degrees of freedom. By attaching the lens housing 142 and performing the active alignment process prior to singulation, the testing and alignment can be performed in a batch process, thereby improving UPH.

In step 508, the molded enclosure 170 is coupled to the lateral side 141c of the lens housing 140. This can be accomplished by depositing an adhesive to either or both the enclosure 170 and the lateral side 141c of the lens housing 140, and then folding the substrate 120 along fold line 661 to press the enclosure 170 against the lateral side 141c, as shown in FIG. 7A. Any of a variety of known adhesives may be used to couple the enclosure 170 to the lens housing 140. In some embodiments, the lens housing 140 may comprise stainless steel, in which case an adhesive suitable for bonding a transfer mold compound with stainless steel would be used. FIGS. 7A-7B show top and bottom perspective views, respectively, of the completed camera module 100.

In step 512, the camera module 100 is coupled to the main board of the electronic device to form a completed camera assembly. This may be accomplished using any of a variety of known methods. As described above, the lower side 121b of the substrate 120 includes a main board contact region 244, which includes a plurality of LGA pads 242 which may be coupled to main board contacts on the main board of the electronic device. In the illustrated embodiment, the LGA pads 242 are provided along a peripheral edge of the lower side 121b of the substrate 120. This can be improve the manufacturability of the camera assembly 100 by permitting easy access to the LGA pads 242 for reworking if one of the soldering bonds between the PGA pads 242 and the main board contacts fails.

Figure 8:
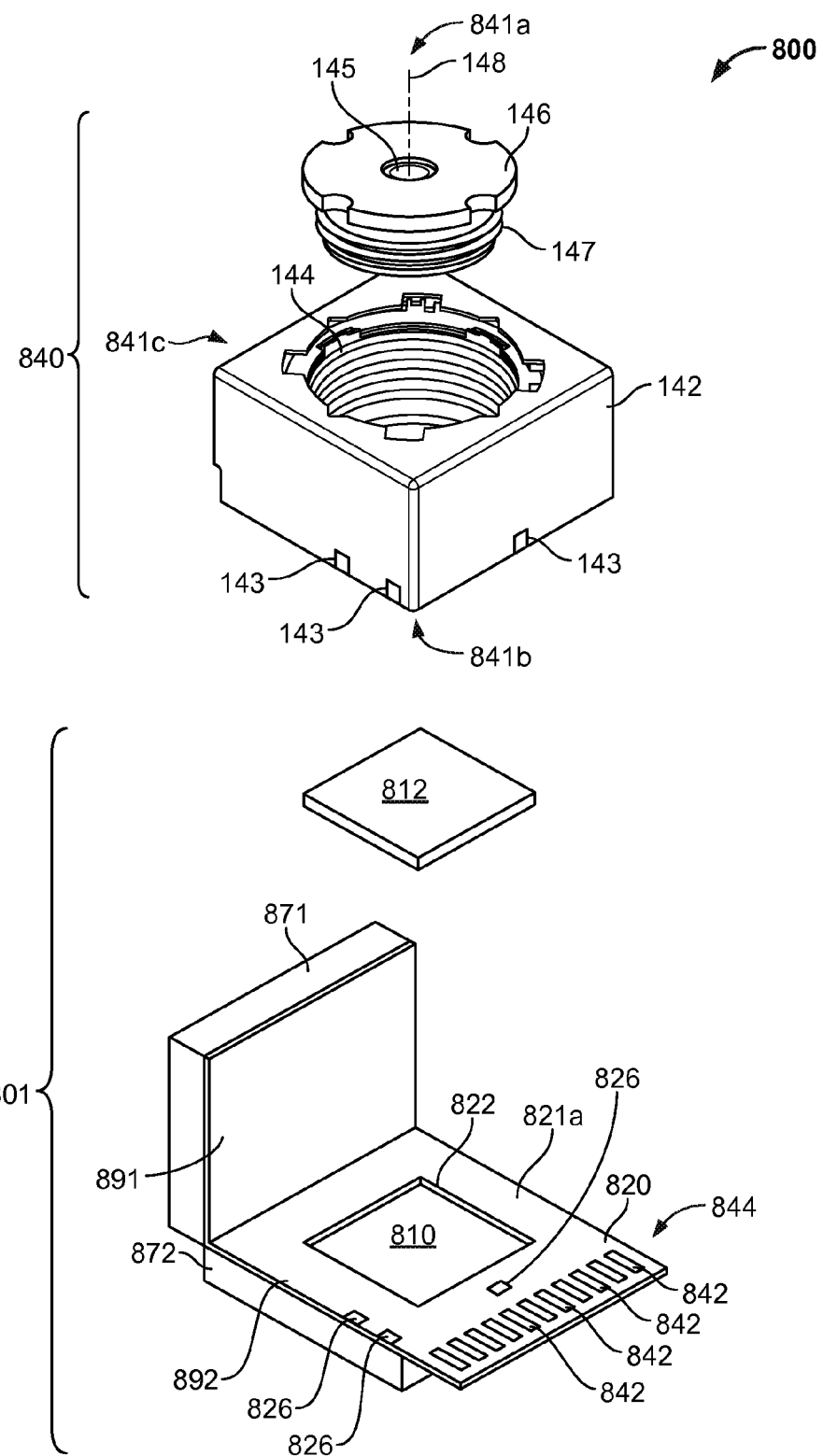
FIG. 8 is an exploded perspective view of a camera module with a folded substrate and laterally positioned components, with an image sensor die positioned in a molded cavity substrate, in accordance with embodiments of the present invention.
Figure 9:
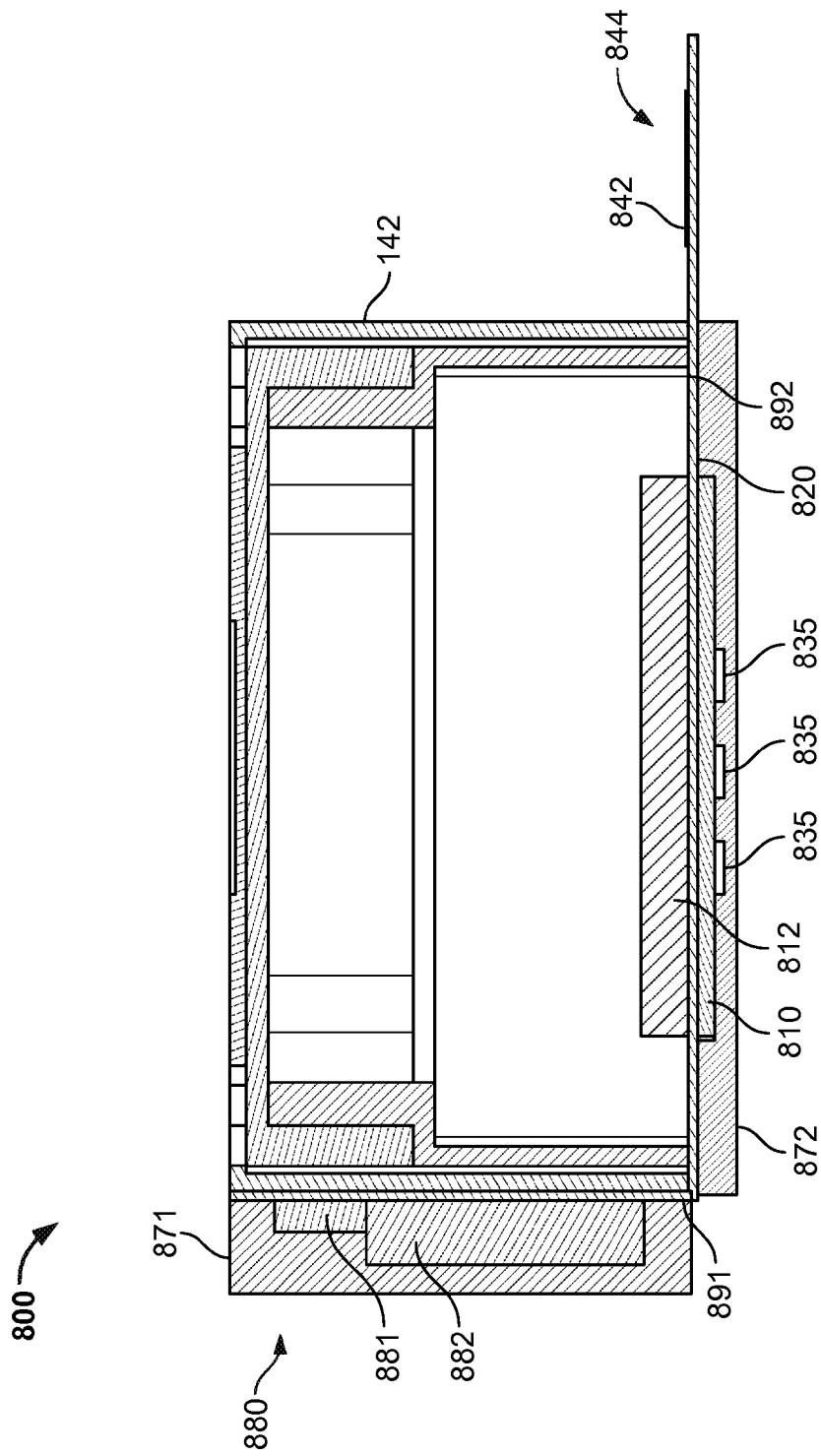
FIG. 9 is a cross-sectional view of a camera module, in accordance with embodiments of the present invention.

FIG. 8 is an exploded perspective view of a camera module 800 with a folded substrate and laterally positioned components, with an image sensor die encapsulated in a molded housing, in accordance with other embodiments of the present invention. FIG. 9 is a cross-sectional view of the camera module 800.

The camera module 800 comprises a lens module 840 and image sensor module 801. The lens module 840 is similar to the lens module 140 described above and comprises an autofocus lens housing 142 forming a cavity containing one or more lenses.

The image sensor module 801 comprises a flexible substrate 820 folded to have a first portion 891 extending over a lateral side 841c of the lens housing 142, and a second portion 892 extending over the image sensor side 841b of the lens housing 142. Optical image stabilization components 880 are coupled to the first portion 891 and encapsulated within a first enclosure 871, and an image sensor die 810 is flip chip bonded to the second portion 892 of the flexible substrate 820 and encapsulated within a second enclosure 872. The optical image stabilization components 880 are similar to the image stabilization components 180 described above with respect to FIG. 1. The substrate 820 includes an image sensor opening 822, which exposes the image sensor die 810 to the light received by the lenses 145.

The substrate 820 may comprise any form of circuit substrate suitable to provide the necessary interconnection structure for operation of the camera module 800, as is well known in the art. The substrate 820 may comprise, for example, a flexible substrate, such as a flexible high density interconnect (HDI) tape substrate, which is available in very thin configurations. The HDI tape substrate may comprise a multilayer interconnect structure using polyimide as a dielectric and electroplated copper conductor lines. The flexible substrate 820 may comprise a flexible base material comprising, e.g., polyester, polyimide, polyethylene naphthalate, or polyetherimide, and conductive layers comprising, e.g., conductive metal foil, electroplated copper, screen printing metal circuits, or other conductive materials. Alternatively, the flexible substrate 820 may comprise a rigid flex substrate having one or more interconnect and dielectric layers.

Figure 10:
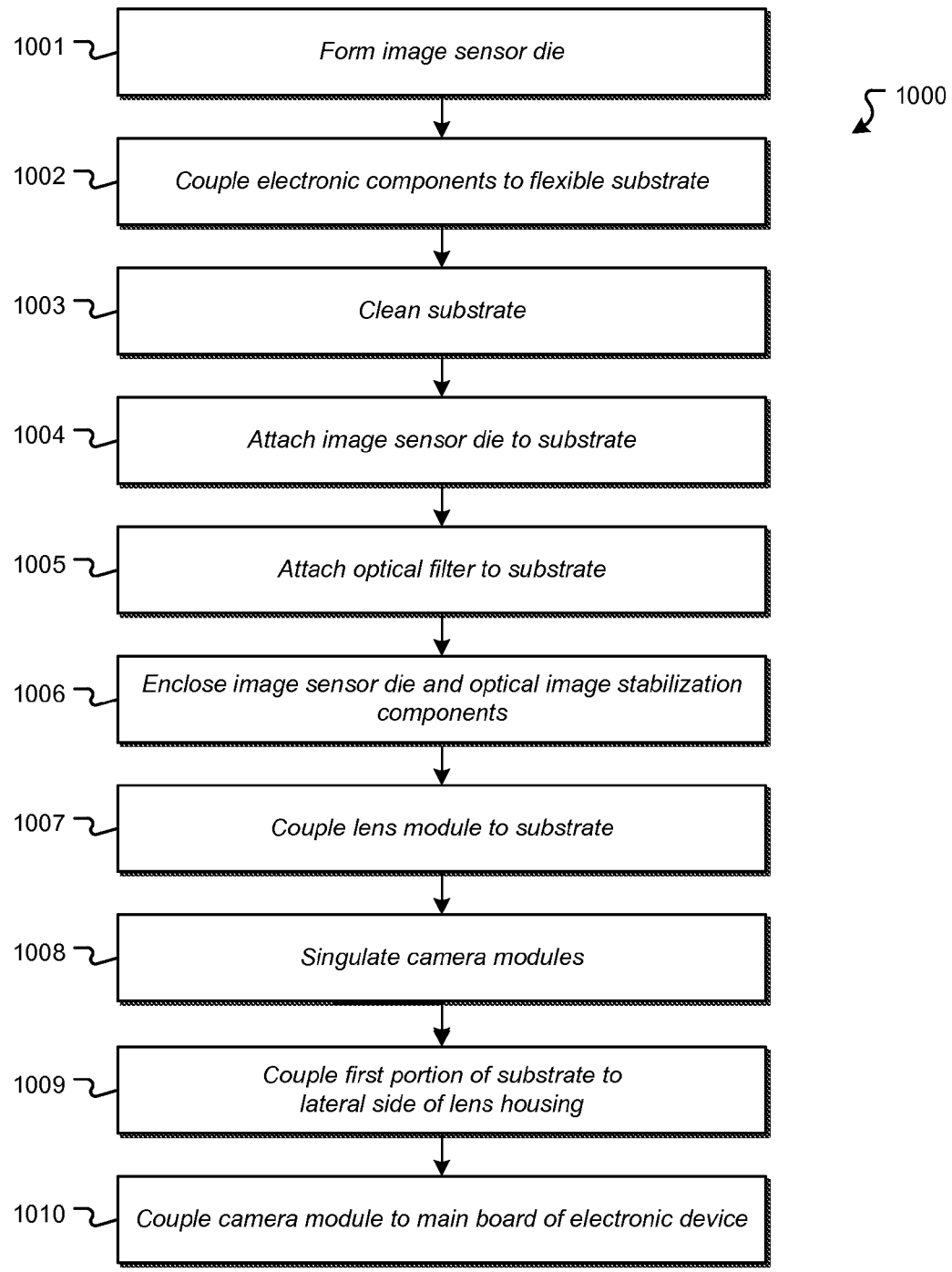
FIG. 10 is a flowchart illustrating a method of manufacturing a camera assembly with a folded substrate and laterally positioned components, with an image sensor die positioned in a molded cavity substrate, in accordance with embodiments of the present invention.

FIG. 10 is a flowchart illustrating a method 1000 of manufacturing a camera assembly 800 with a flexible substrate 820 folded to have a first portion 891 extending over a lateral side 841c of the lens housing 142, and a second portion 892 extending over the image sensor side 841b of the lens housing 142. FIGS. 11A-11G illustrate various steps in the manufacturing method 1000.

Figure 11A:
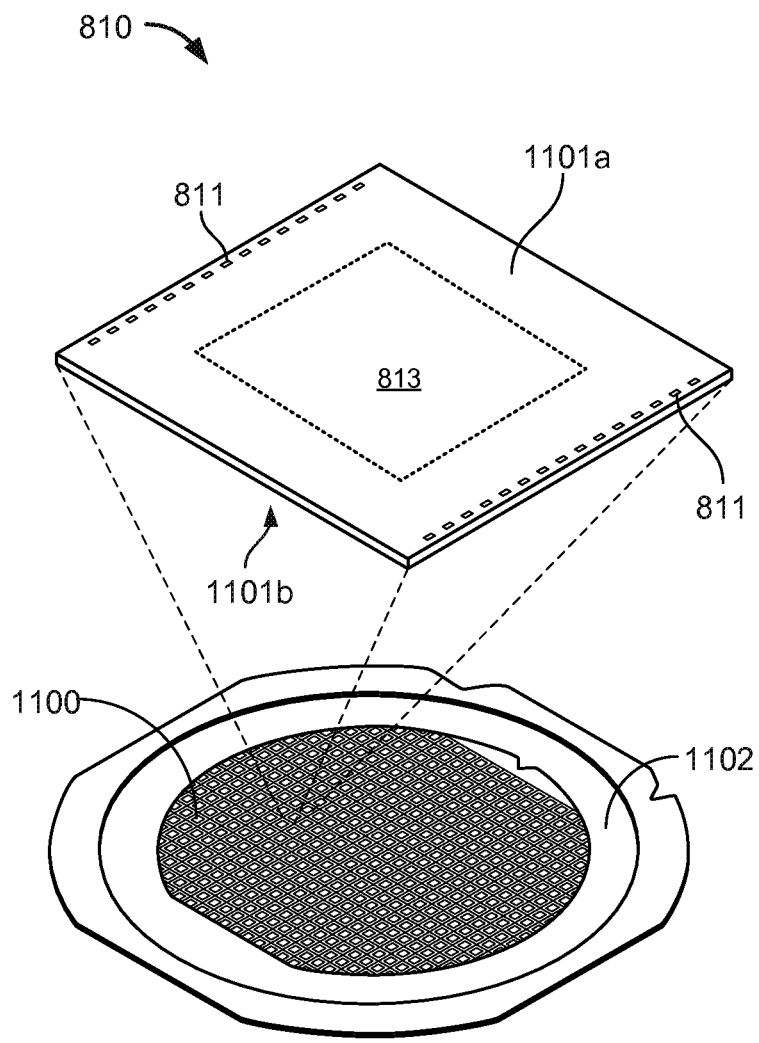
FIGS. 11A-11G illustrate various steps in the manufacturing process illustrated in FIG. 10.

In step 1001, shown in FIG. 11A, the image sensor die 810 is formed. Before each image sensor die 810 is singulated or diced from the wafer 1100 held in the wafer carrier 1102, a plurality of die contacts 811 are formed on the upper surface 1101a of each image sensor die 810. The die contacts 811 can be formed in a variety of ways, depending on the desired method of coupling the image sensor die 810 to the substrate 820.

Figure 11B:
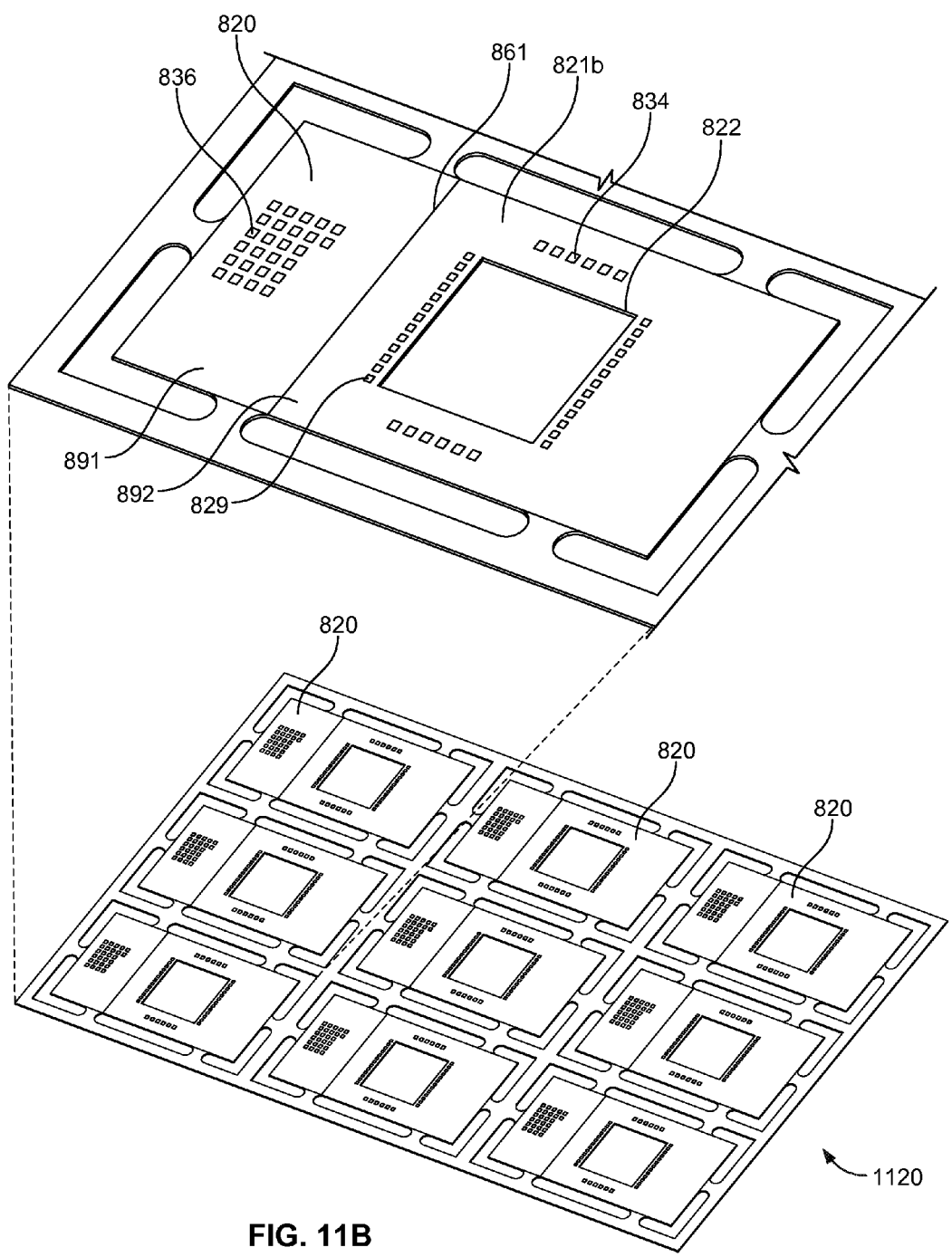
Figure 11C:
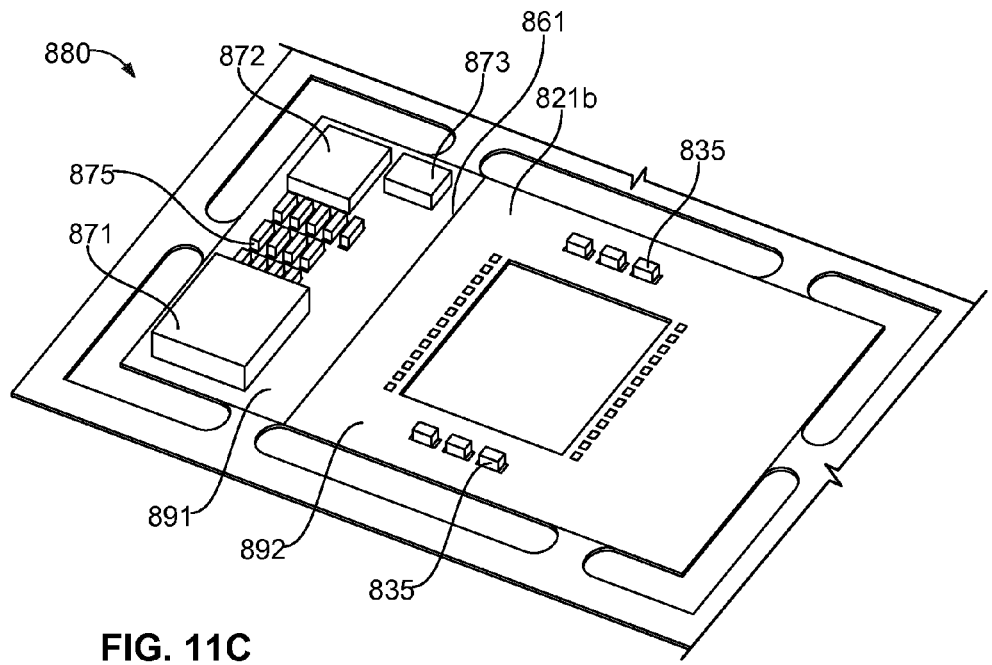
Figure 11D:
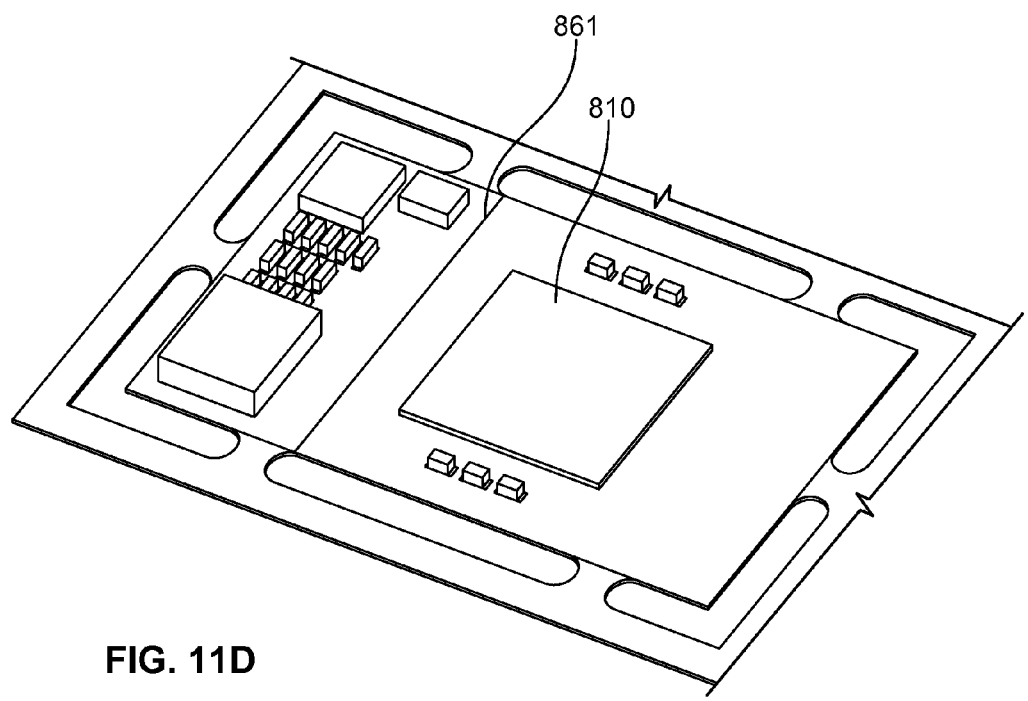

In step 1002, shown in FIGS. 11B-11C, electronic components are coupled to the substrate 820. In order to lower cost and improve manufacturing throughput, a plurality of substrates 820 may be provided in a substrate strip array 1120. This can enable each of the subsequent steps to be performed in batch processes simultaneously on all of the substrates 820 in the array 1120.

As described above, the flexible substrate 820 comprises a first portion 891 which is positioned adjacent to the lateral side 841c of the lens module 140, and a second portion 892 which is positioned adjacent to the image sensor side 841b of the lens module 140. FIG. 1 lB shows that the lower surface 821b of the second portion 892 of the substrate 820 includes a plurality of substrate-sensor contacts 829 for coupling with the die contacts 811 of the image sensor die 810. The lower surface 821b of the second portion 892 of the substrate 820 further includes a plurality of component contacts 834 for coupling with the electronic components 835 (shown in FIG. 11C). The electronic components 835 coupled to the second portion 892 may include passive and/or active components for processing the output signals from the image sensor die 810 (e.g., decoupling capacitors), similar to the electronic components 135 described above.

The components mounted to the first portion 891 of the substrate 820 may comprise image stabilization components 880 used to provide an optical image stabilization (OIS) functionality for the camera module 800, similar to the image stabilization components 180 described above. These image stabilization components 880 may comprise, for example, a gyroscopic sensor 871, a memory 872, an optical image stabilization logic module 873, and passive electronic components 875. The image stabilization components 880 may be mounted to the substrate 820 using any suitable manufacturing technique, such as the SMT mounting process described above.

Fold line 861 is shown for illustrative purposes to indicate where the substrate 820 will be folded when coupled to the lens module 140, as will be described in greater detail below. In some embodiments, fold line 861 corresponds to a mechanical feature in the substrate 820 for facilitating the folding of the substrate 820. In other embodiments, the fold line 861 does not represent any physical features and is merely illustrative of the location of a later folding step.

In step 1003, the substrate 820 is cleaned to remove impurities or other contaminants that may have been deposited onto the substrate 820 in previous steps prior to coupling with the image sensor die 810.

In step 1004, the image sensor die 810 is attached to the substrate 820. The bonding of the image sensor die 810 to the substrate 820 may be performed in a variety of ways. In the embodiment illustrated in FIG. 11D, flip-chip bonding is used to bond gold stud bump die contacts 811 (shown in FIG. 11A) with substrate-sensor land pad contacts 829 (shown in FIG. 11B). In the embodiment shown in FIG. 11C, all of the components that are attached to the substrate 820 prior to encapsulation are all attached to the lower surface 821b. Because the substrate 820 is flexible, it is desirable that the upper surface 821a be substantially flat so when the upper surface 821a of the substrate 820 is positioned on a flat support surface during the SMT and flip-chip bonding processes, the lower surface 821b remains flat. This can help to provide more accurate placement and reliable bonding of components to the lower surface 821b of the substrate 820.

In one embodiment, flip chip bonding using a conductive epoxy process followed by a jetting underfill process may be used to attach the image sensor die 810 to the substrate 820. In another embodiment, flip chip bonding using a thermal ultrasonic (T/S) bonding process to form an inter-metallic coverage (IMC) between the die contacts 811 and substrate-sensor contacts 829 followed by a jetting underfill process may be used. In another embodiment, flip chip bonding using a thermal-compression (T/C) bonding process with a non-conductive paste (NCP) dispensed on the substrate-sensor contacts 829 may be used. In another embodiment, flip chip bonding of plated bump die contacts 811 using a T/C bonding process with an anisotropic conductive paste (ACP) dispensed on the substrate-sensor contacts 829 may be used.

Figure 11E:
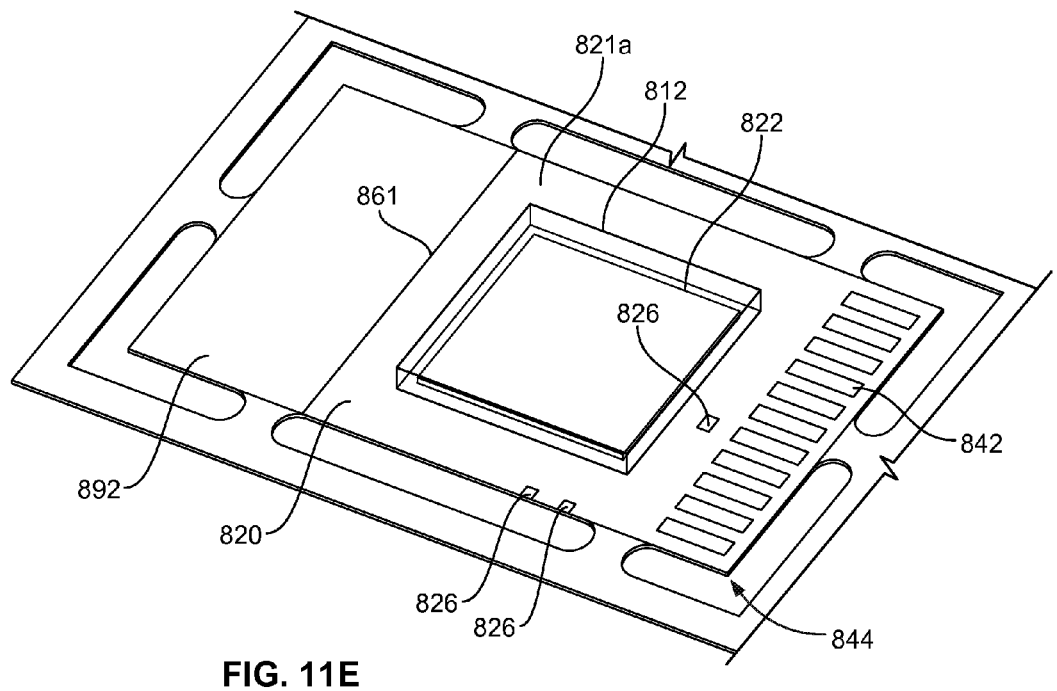

In step 1005, shown in FIG. 11E, the optical filter 812 is coupled to the upper surface 821a of the substrate 820. The optical filter 812 can be any type of filter desired for the camera module 800, similar to the optical filter 112 described above. The optical filter 812 is bonded to the edge of the upper surface 821a around the image sensor opening 822, thereby providing a protective seal to prevent contaminants and other debris from contacting the photosensor portion 813 of the image sensor die 810. This protection is particularly advantageous when the substrate 820 is exposed to high levels of contaminants, as occurs during the transfer molding process described below. In other embodiments, the optical filter 812 may be attached to the substrate 820 before the image sensor die 810 is attached. This can provide a more consistently flat surface for flip chip bonding of the die 810.

As shown in FIG. 11E, a plurality of lens module connections 826 may be provided on the substrate 820. Similar to the lens module connections 126 described above, the lens module connections 826 may couple with corresponding contacts 143 (shown in FIG. 8) in the lens housing 142. These lens module connections 826 may be used to provide power, ground, and control signals to the lens module 840. The various contacts provided on the substrate 120 may be formed, e.g., using electroless nickel immersion gold (ENIG) plating techniques. ENIG is an electroless nickel layer capped with a thin layer of immersion gold, which provides a multi-functional surface finish. The immersion gold protects the underlying nickel from oxidation/passivation.

Figure 11F:
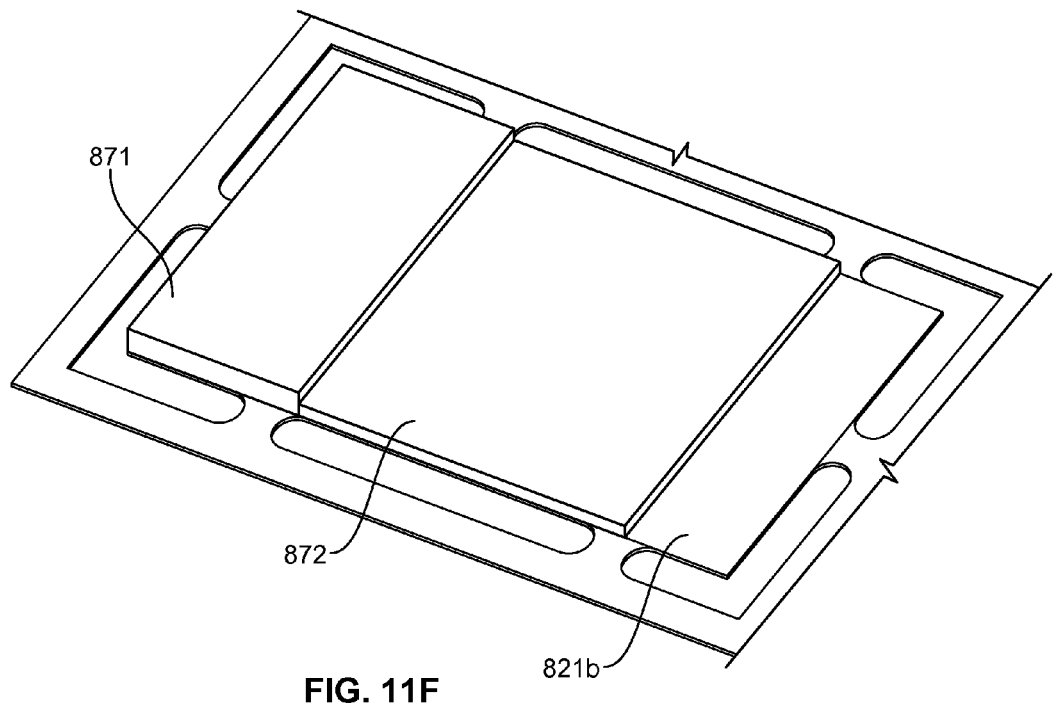

In step 1006, shown in FIG. 11F, the image stabilization components 880 are enclosed in a first enclosure 871, and the image sensor die 810 is enclosed in a second enclosure 872. In some embodiments, the enclosures 871-872 comprise any of a variety of transfer molding materials well-known in the semiconductor packaging industry. The transfer molding material may comprise a resin with a hardener, accelerator, fillers, flame retardants, and other modifiers, such as an epoxy resin with a silica filler. In the illustrated embodiment, the molded enclosures 871-872 serve to protect the image stabilization components 880 and the image sensor die 810. The transfer molding material can be advantageous in this application because its manufacturing processes are well known and relatively inexpensive, and its physical characteristics are well documented. The two enclosures 871-872 may be formed as separate structures with a gap between to enable folding of the substrate 820 along fold line 861.

In other embodiments, the enclosures 871-872 may comprise another material. Rigid enclosures 871-872 comprising, e.g., a metal or polymer, may be formed prior to attachment to the substrate 820, and may be attached to the substrate 820 to enclose the image stabilization components 880 and image sensor die 810. In some embodiments, grounded metal enclosures 871-872 may advantageously provide RF shielding and isolation for the electronic components contained therein.

In some embodiments, the two enclosures 871-872 are formed in a single process step utilizing two separate mold cavities to form the enclosures 871-872. In batch processing embodiments where a plurality of substrates 820 are processed simultaneously in a substrate strip array 1120, all of the enclosures for all of the substrates 820 may be formed in a single process step.

Figure 11G:
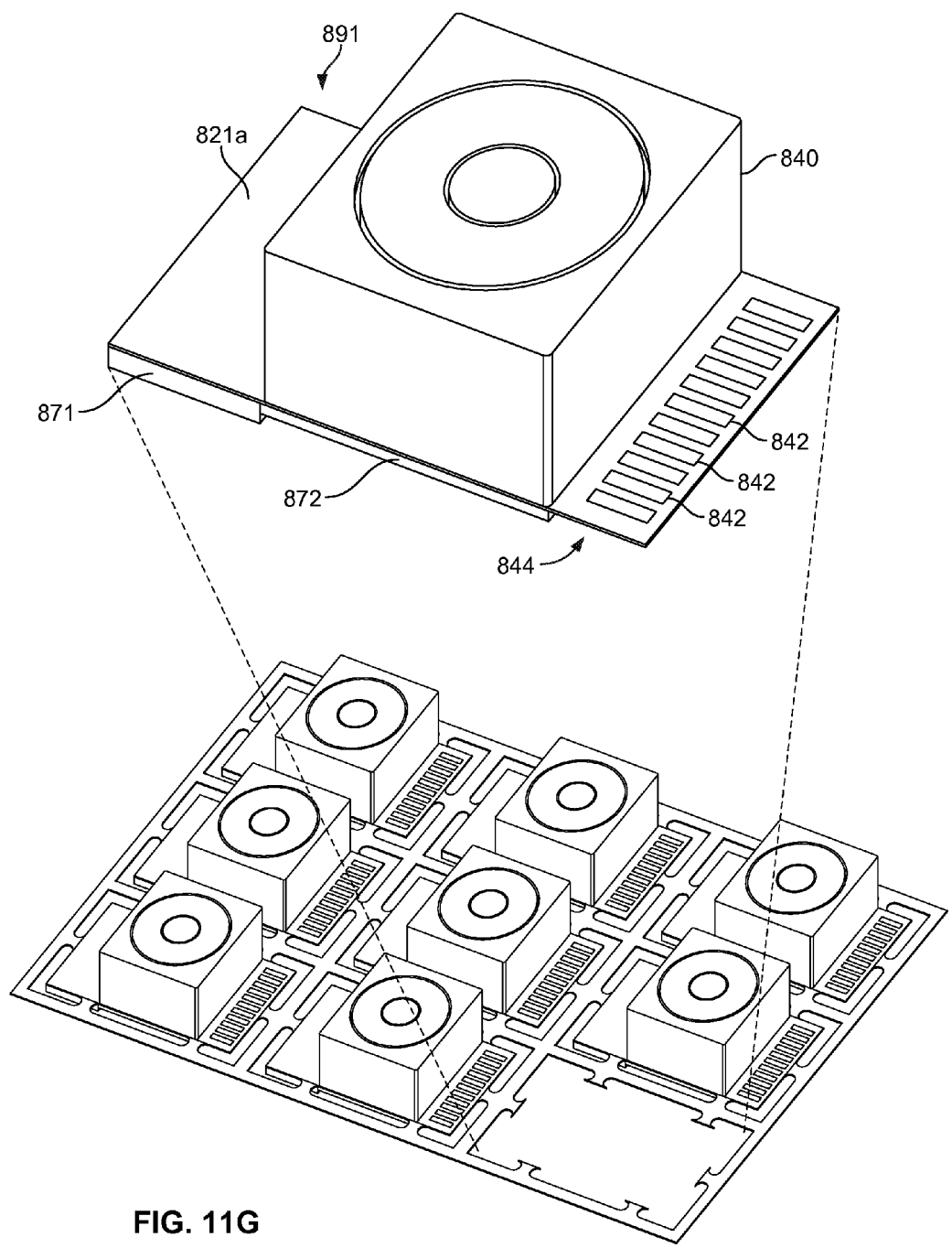

In step 1007, shown in FIG. 11G, a lens module 840 is coupled to each of the substrates 820 in the substrate strip array 1120. The lens housing 842 of the lens module 840 may be attached to the substrate 820 by depositing an adhesive, such as an epoxy adhesive, onto a portion of the substrate 820 not otherwise used for electrical connections. The lens module connections (not shown) on the substrate 820 may then be coupled to the corresponding contacts (not shown) in the lens housing 842 using, for example, conventional soldering methods. Testing and active alignment of the lenses 145 may be performed after attachment of the lens housing 145 but prior to singulation.

In step 1008, each camera module 800 may then be singulated from the strip array 1120 for integration with an electronic device, such as computing device 200. In other embodiments, the substrates 820 may be singulated from the strip array 1120 prior to attachment of the lens housings 842.

Figure 12A:
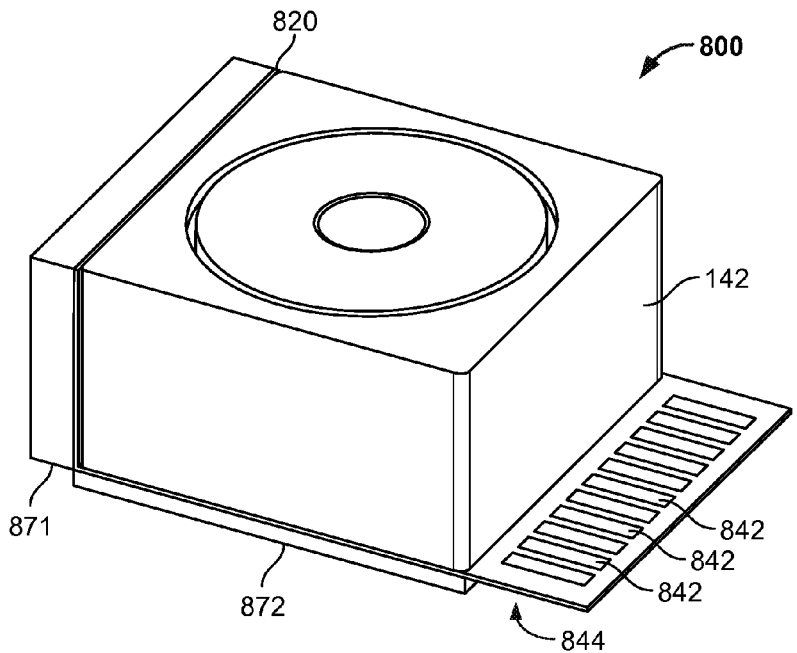
FIGS. 12A-12B illustrate perspective views of a camera module, in accordance with embodiments of the present invention.
Figure 12B:
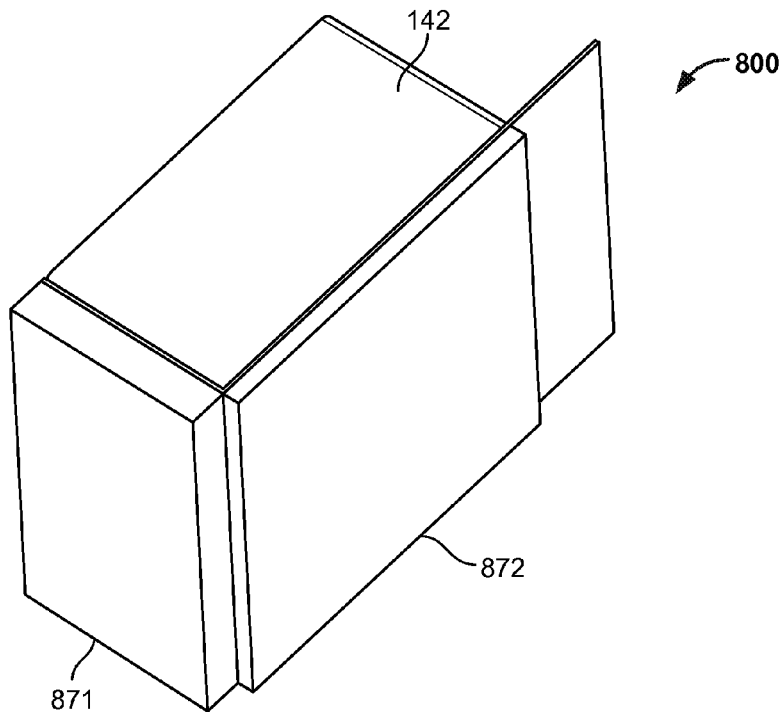

FIGS. 12A-12B show top and bottom perspective views, respectively, of the completed camera module 800. In step 1009, the first portion 891 of the substrate 820 is coupled to the lateral side 841c of the lens housing 840, as shown in FIGS. 12A-12B. This can be accomplished by depositing an adhesive to either or both the lateral side 841c of the lens housing 840 and the upper surface 821a of the first portion 891 of the substrate 820. Then, the substrate 820 is folded along fold line 861 to press the upper surface 821a of the first portion 891 of the substrate 820 against the lateral side 841c. Any of a variety of known adhesives may be used to couple the first portion 891 of the substrate 820 to the lens housing 840. In some embodiments, the lens housing 840 may comprise stainless steel, in which case an adhesive suitable for bonding the material of the substrate 820 with stainless steel would be used.

In step 1010, the camera module 800 is coupled to the main board of the electronic device to form a completed camera assembly. This may be accomplished using any of a variety of known methods. In the illustrated embodiment, the upper side 821a of the flexible substrate 820 includes a main board contact region 844. The main board contact region 844 includes a plurality of LGA pads 842 which may be coupled to main board contacts on the main board of the electronic device, similar to the LGA pads 242 described above. The LGA pads 842 can be bonded (e.g., soldered) directly to corresponding contacts on the main board or coupled to another intermediate interposer structure, such as a cable or circuit board, which is coupled to the main board. The portion of the substrate 820 comprising the main board contact region 844 may extend beyond the second enclosure 872. The region directly underneath the extending main board contact region 844 may provide clearance for other components in the electronic device into which the camera module 800 is installed.

As shown in FIGS. 12A-12B, the first enclosure 871 is sized so as to have approximately the same length and width of the lateral side 841c of the lens housing 840, and the second enclosure 872 is sized so as to have approximately the same length and width of the image sensor side 841b of the lens housing 840. As a result, the camera module 800 is provided with a roughly rectangular form factor. This may improve the ease with which the camera module 800 is handled in later processing steps, such as when coupling the camera module 800 to the main board of the electronic device 200. In other embodiments, the first and second enclosures 871-872 may have different sizes. This may be desirable if the region of the substrate 820 to be enclosed by the enclosure 871-872 is substantially smaller than the corresponding side of the lens housing 840. In this case, the enclosures 871-872 may be smaller than the corresponding lens housing side, such as, e.g., ¾, ½, or ¼ of the size of the corresponding side 841b or 841c to which the enclosure is positioned adjacent. In other embodiments, the enclosures 871-872 may be larger than the corresponding side.

Figure 13:
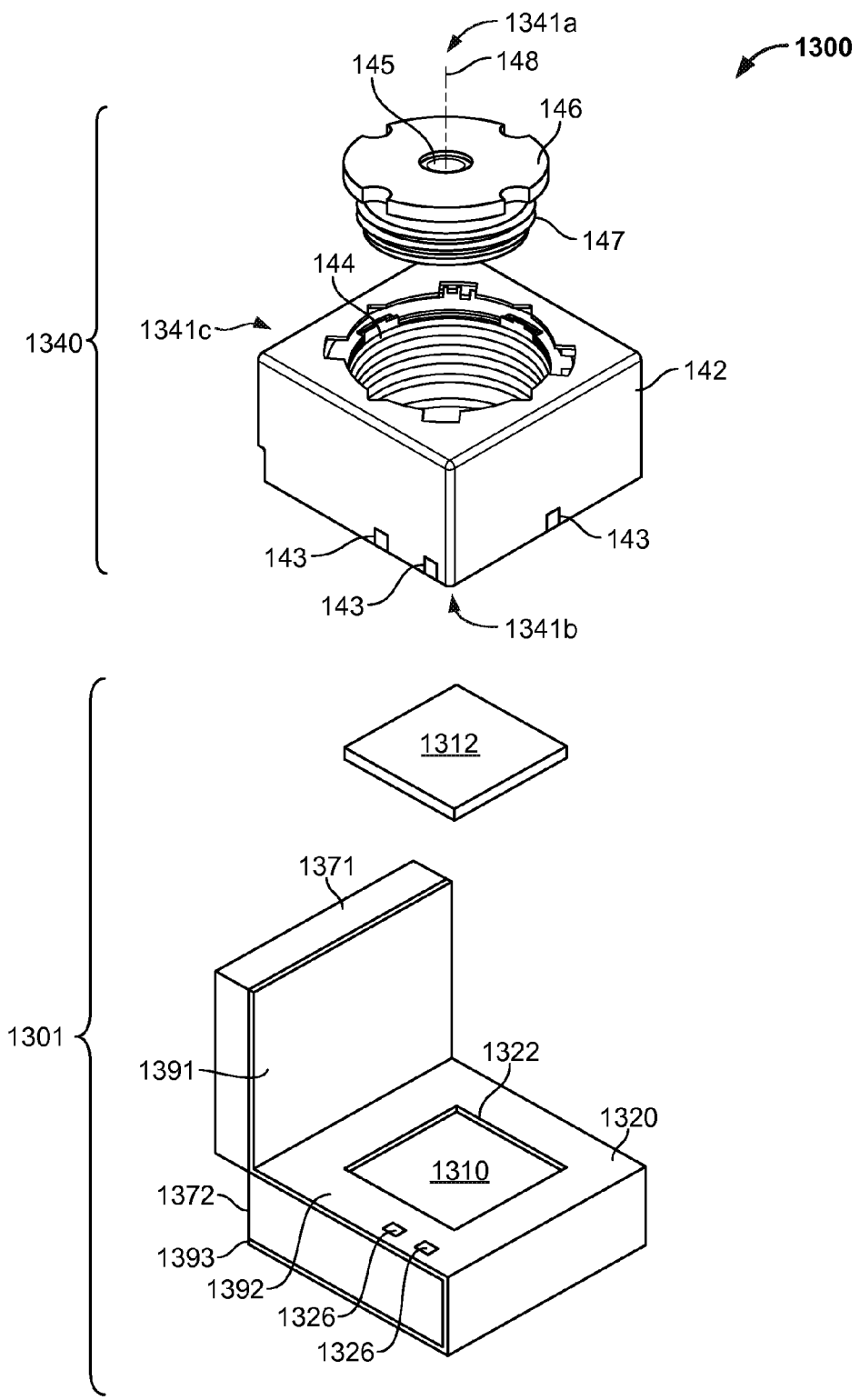
FIG. 13 is an exploded perspective view of a camera module with a folded substrate and laterally positioned components, with an image sensor die positioned in a molded cavity substrate, in accordance with embodiments of the present invention.
Figure 14:
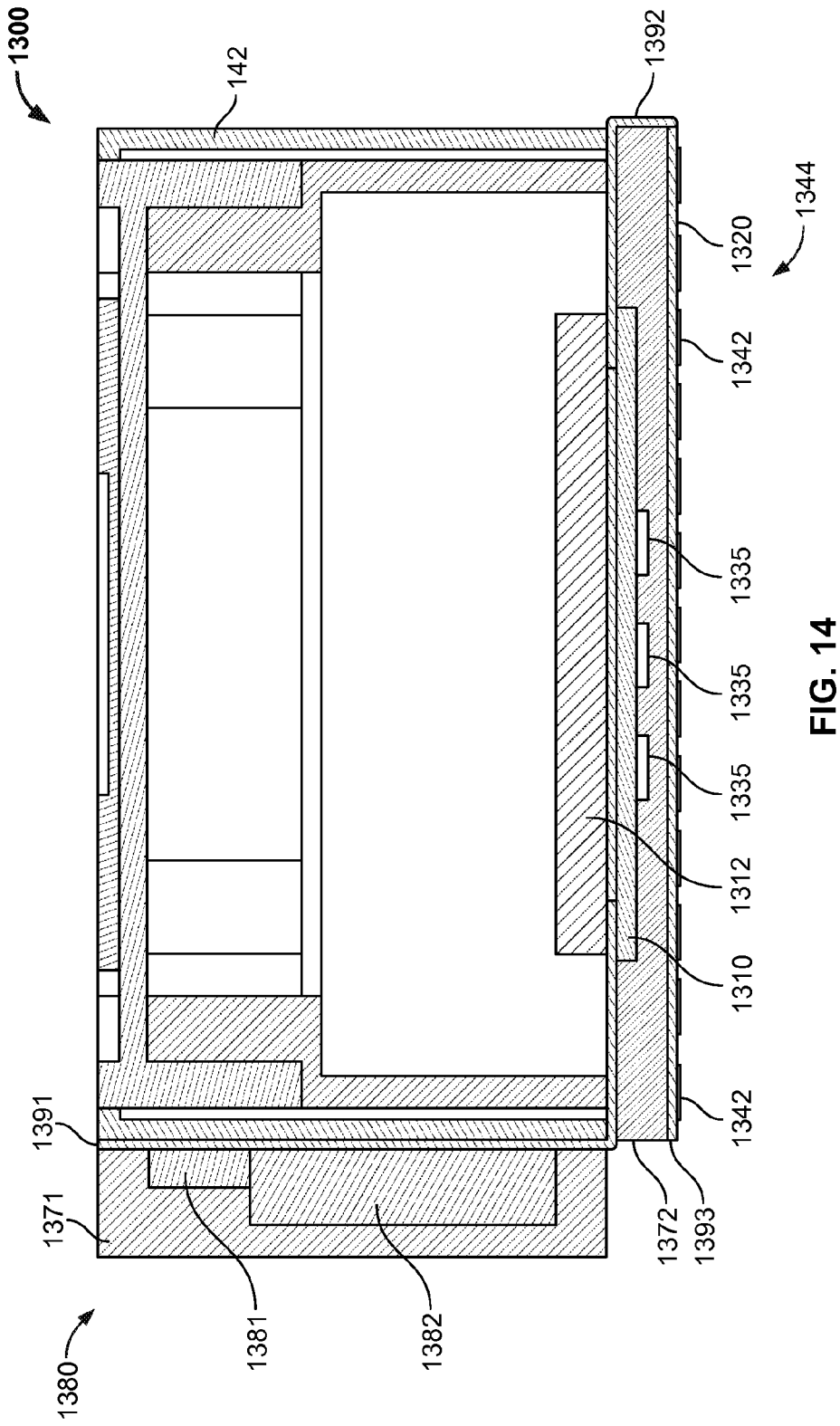
FIG. 14 is a cross-sectional view of a camera module, in accordance with embodiments of the present invention.

FIG. 13 is an exploded perspective view of a camera module 1300 with a folded substrate and laterally positioned components, with an image sensor die positioned in a molded cavity substrate, in accordance with other embodiments of the present invention. FIG. 14 is a cross-sectional view of the camera module 1300.

The camera module 1300 is similar to the camera module 800 described above and comprises a lens module 1340 and image sensor module 1301.

Like the image sensor module 801, the image sensor module 1301 comprises a flexible substrate 1320 folded to have a first portion 1391 extending over a lateral side 1341c of the lens housing 142, and a second portion 1392 extending over the image sensor side 1341b of the lens housing 142. Optical image stabilization components 1380 are coupled to the first portion 1391 and encapsulated within a first enclosure 1371, and an image sensor die 1310 is flip chip bonded to the second portion 1392 of the flexible substrate 1320 and encapsulated within a second enclosure 1372. The optical image stabilization components 1380 are similar to the image stabilization components 180 described above with respect to FIG. 1. The substrate 1320 includes an image sensor opening 1322, which exposes the image sensor die 1310 to the light received by the lenses 145. However, the flexible substrate 1320 shown in FIG. 13 also includes a third portion 1393 which is folded over to wrap around a bottom surface of the second enclosure 1372.

The third portion 1393 includes a main board contact region 1344 comprising a plurality of LGA pads 1342 which may be coupled to main board contacts on the main board of the electronic device. The LGA pads 1342 receive all of the power and I/O signals required for operation of the camera module 1300. The LGA pads 1342 can be bonded (e.g., soldered) directly to corresponding contacts on the main board, coupled to an LGA socket mounted to the main board, or coupled to another intermediate interposer structure, such as a cable or circuit board, which is coupled to the main board.

The substrate 1320 may comprise any form of circuit substrate suitable to provide the necessary interconnection structure for operation of the camera module 1300, and preferably comprises a flexible substrate, as described above with respect to substrate 820.

Figure 15:
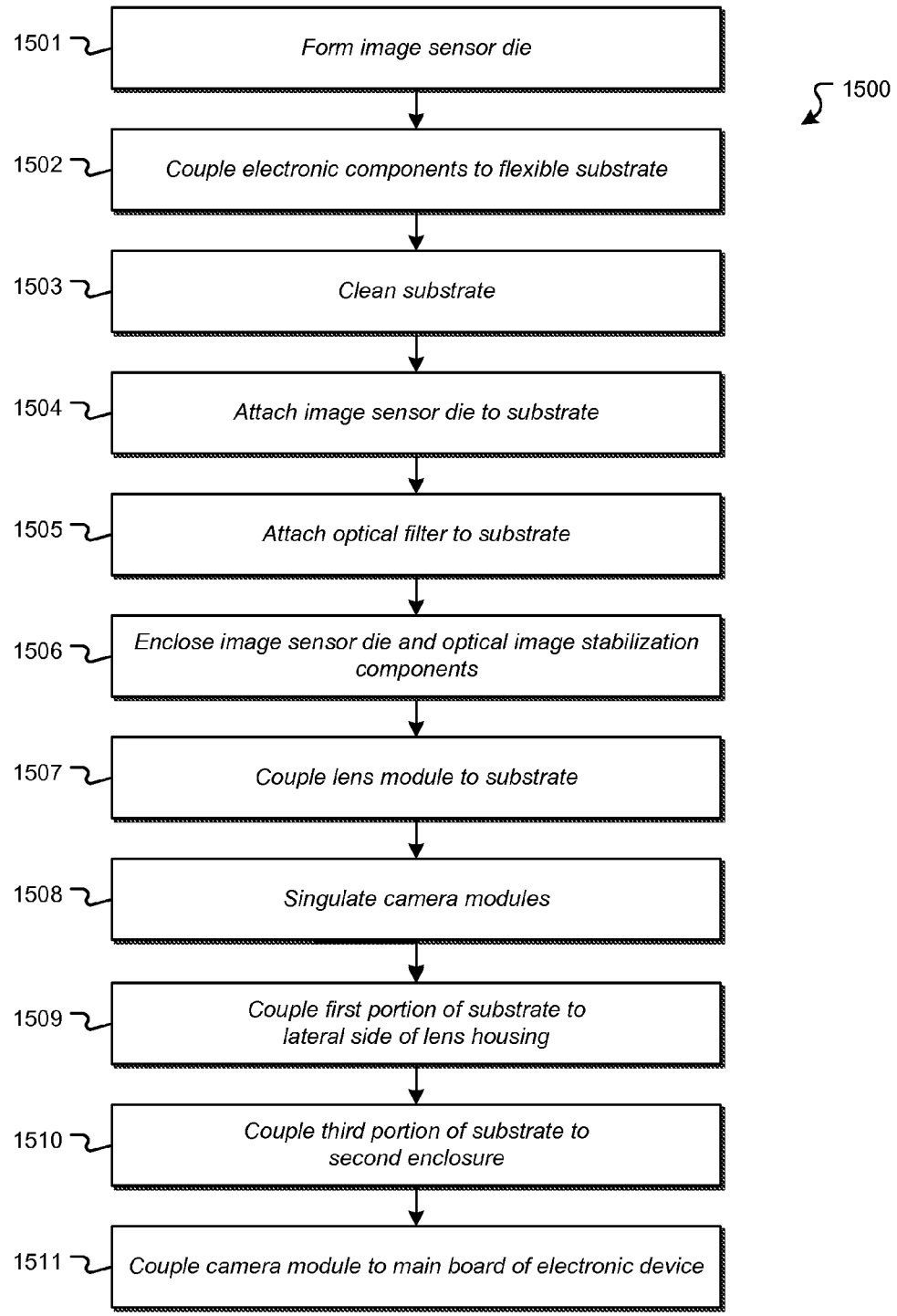
FIG. 15 is a flowchart illustrating a method of manufacturing a camera assembly, in accordance with embodiments of the present invention.

FIG. 15 is a flowchart illustrating a method 1500 of manufacturing a camera assembly 1300 with a flexible substrate 1320 folded to have a first portion 1391 extending over a lateral side 1341c of the lens housing 142, a second portion 1392 extending over the image sensor side 1341b of the lens housing 142, and a third portion 1393 comprising a main board contact region 1344. FIGS. 16A-16F illustrate various steps in the manufacturing method 1500.

In step 1501, the image sensor die 1310 is formed in a similar fashion as described above.

Figure 16A:
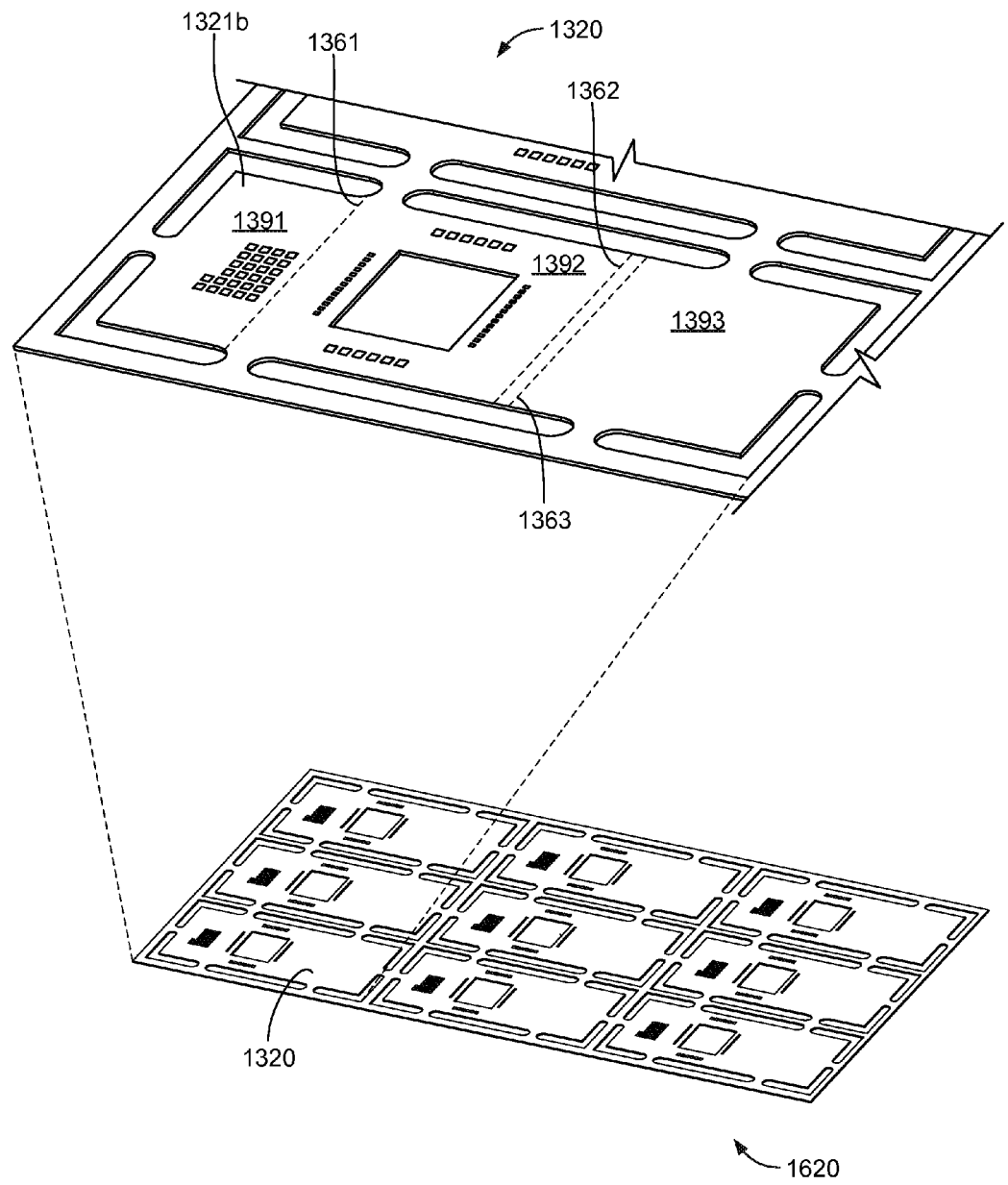
FIGS. 16A-16F illustrate various steps in the manufacturing process illustrated in FIG. 10.
Figure 16B:
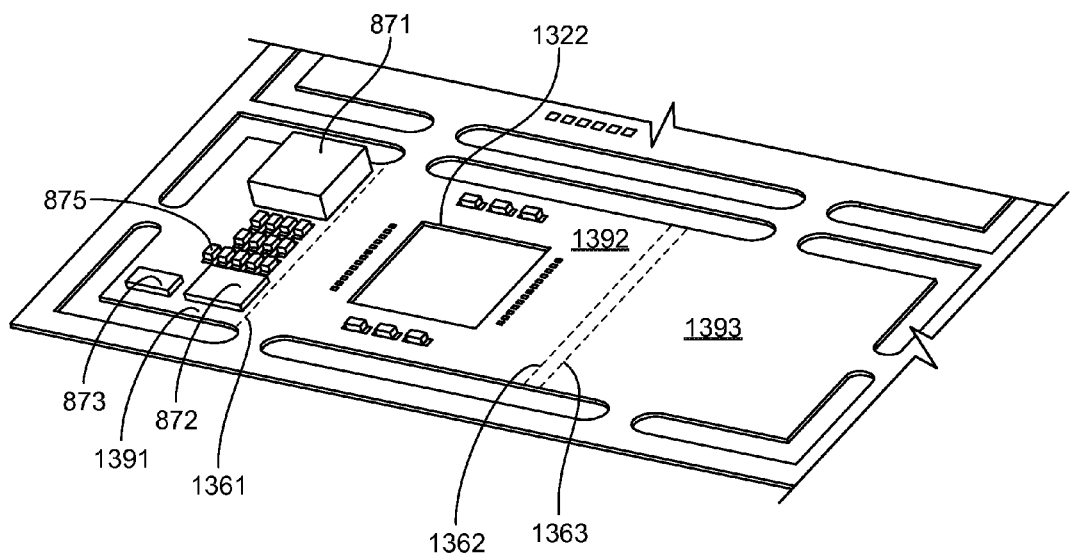
Figure 16C:
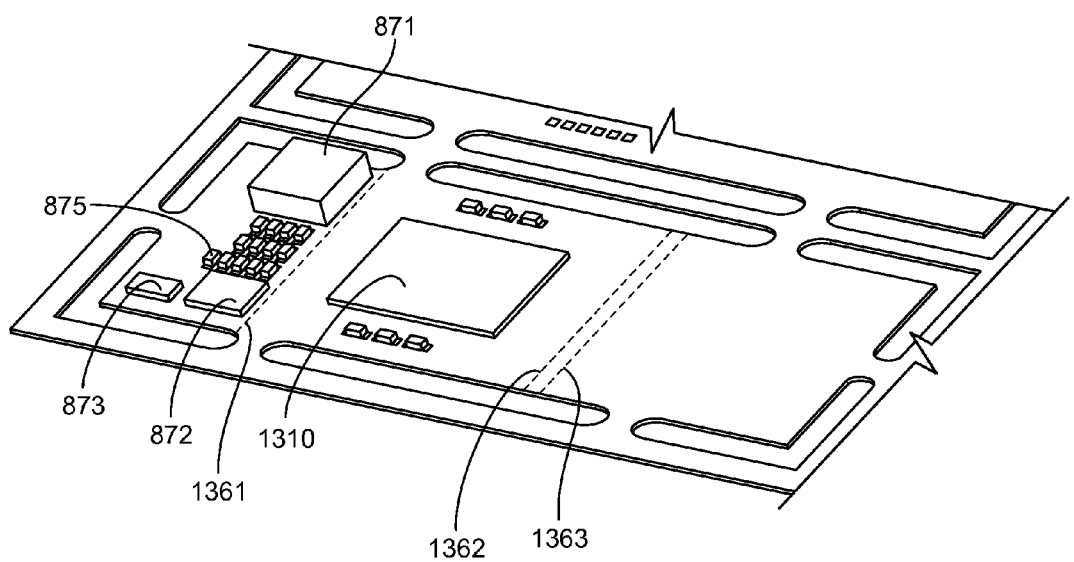
Figure 16D:
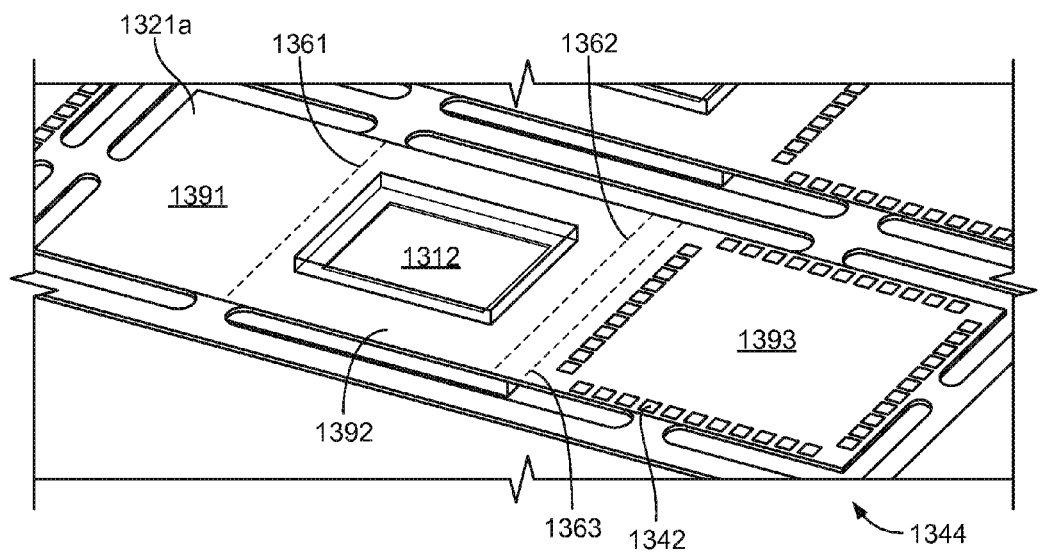

In step 1502, shown in FIGS. 16A-16B, electronic components are coupled to the substrate 1320. In order to lower cost and improve manufacturing throughput, a plurality of substrates 1320 may be provided in a substrate strip array 1620.

As described above, the flexible substrate 1320 comprises a first portion 1391 which is positioned adjacent to the lateral side 1341c of the lens module 1340, and a second portion 1392 which is positioned adjacent to the image sensor side 1341b of the lens module 1340. FIG. 16A shows that the lower surface 1321b of the second portion 1392 of the substrate 1320 includes a plurality of substrate-sensor contacts 1329 for coupling with the die contacts 1311 of the image sensor die 1310. The lower surface 1321b of the second portion 1392 of the substrate 1320 further includes a plurality of component contacts 1334 for coupling with the electronic components 1335, similar to the electronic components 835 described above. The components mounted to the first portion 1391 of the substrate 1320 may comprise image stabilization components 1380, similar to the image stabilization components 880 described above.

Fold lines 1361-1363 are shown for illustrative purposes to indicate where the substrate 1320 will be folded when coupled to the lens module 1340, as will be described in greater detail below.

In step 1503, the substrate 1320 is cleaned to remove impurities or other contaminants. In step 1504, shown in FIG. 16C, the image sensor die 1310 is attached to the substrate 1320. The bonding of the image sensor die 1310 to the substrate 1320 may be performed in a variety of ways, as described above with respect to image sensor die 810.

In step 1505, shown in FIG. 11E, the optical filter 1312 is coupled to the upper surface 1321a of the substrate 1320, as described above with respect to optical filter 812.

Figure 16E:
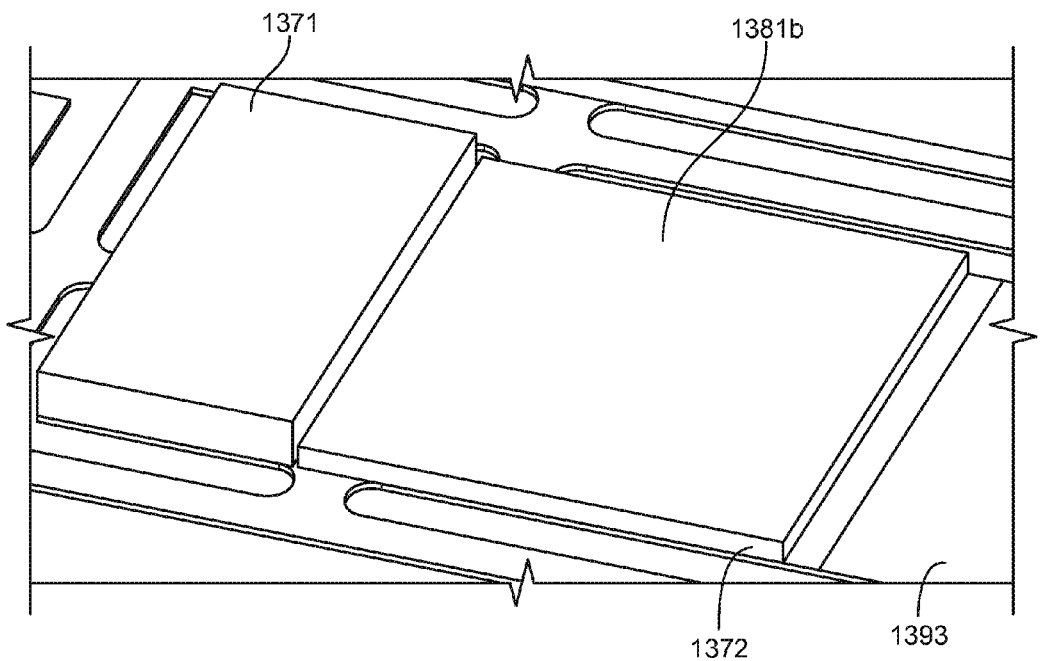

In step 1506, shown in FIG. 16E, the image stabilization components 1380 are enclosed in a first enclosure 1371, and the image sensor die 1310 is enclosed in a second enclosure 1372, as described above with respect to enclosures 871-872.

Figure 16F:
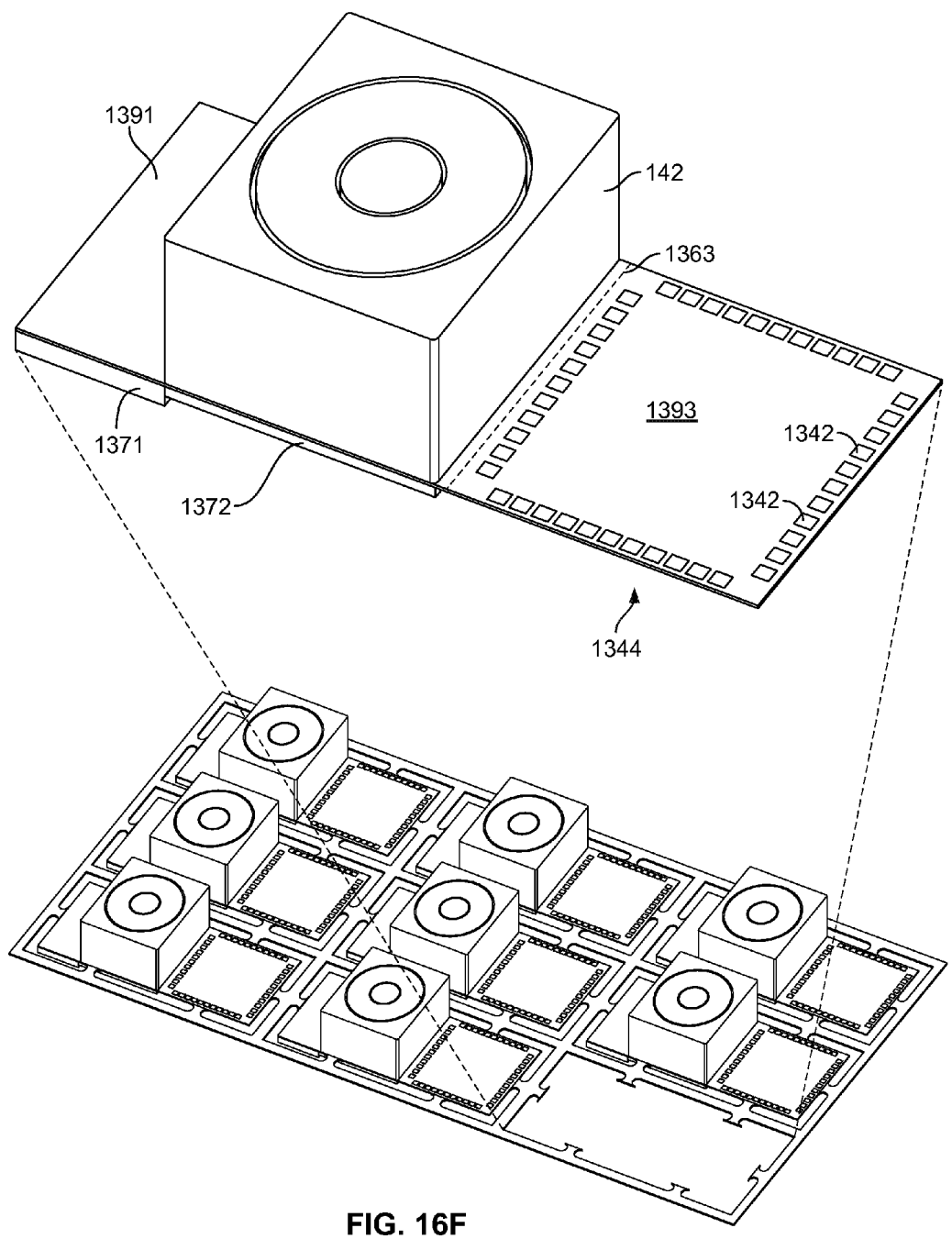

In step 1507, shown in FIG. 16F, a lens module 1340 is coupled to each of the substrates 1320 in the substrate strip array 1120.

In step 1508, each camera module 1300 may then be singulated from the strip array 1120, as described above. As shown in FIG. 16F, the third portion 1393 of the substrate 1320 extends past the edge of the lens housing 142.

In step 1509, the first portion 1391 of the substrate 1320 is coupled to the lateral side 1341c of the lens housing 1340, as described above with respect to FIGS. 12A-12B.

Figure 17A:
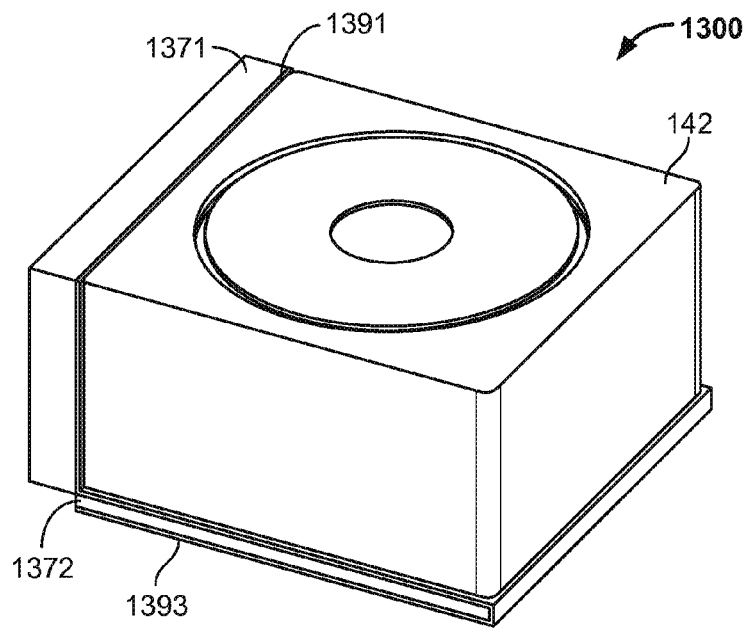
FIGS. 17A-17B illustrate perspective views of a camera module, in accordance with embodiments of the present invention.
Figure 17B:
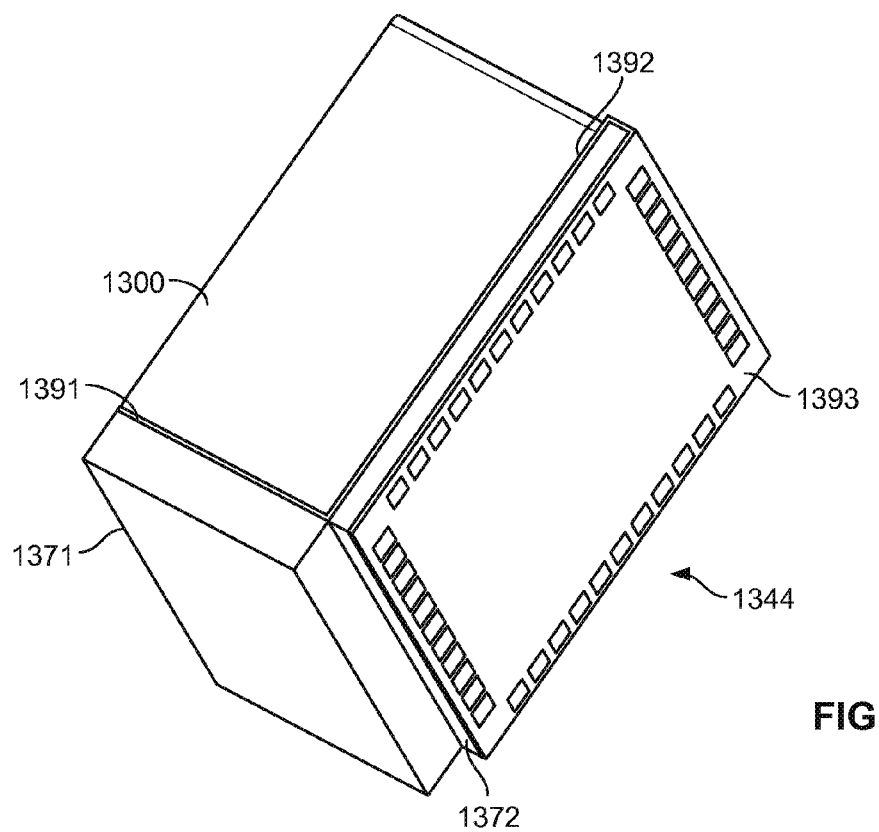

In step 1510, the third portion 1393 of the substrate 1320 is coupled to the lower side 1381b (shown in FIG. 16E) of the second enclosure 1372. This can be accomplished by depositing an adhesive to either or both the lower side 1381b of the second enclosure 1372 and the third portion 1391 of the substrate 1320. Then, the substrate 1320 is folded along fold lines 1362, 1363 to press the third portion 1393 of the substrate 1320 against the edge and lower side 1381b the second enclosure 1372 to produce the completed camera module 1300 shown in the top and bottom perspective views, respectively, of FIGS. 17A-17B.

In step 1011, the camera module 1300 is coupled to the main board of the electronic device to form a completed camera assembly. Because the main board contact region 1344 is provided on the bottom of the camera module 1300, the camera module can be bonded directly to the main board of the electronic device 200, without need for a separate socket or interposer structure. In addition, the substantially rectangular shape of the camera module 1300 can improve the ease with which the camera module 1300 is handled and assembled into the electronic device 200.

The above-described embodiments may achieve a number of advantages over conventional camera module designs. The overall size of the camera module may be reduced. Positioning the optical image stabilization components in an encapsulated enclosure along the lateral side of the lens housing can reduce the overall size of the camera module and, in particular, reduce the height of the camera module by moving some of the electronic components to the lateral side of the lens housing.

Because HDI tape substrates provide much higher line pitch than conventional laminate substrates, the use of HDI tape substrates can enable a reduction in the number of layers necessary for the interconnect structure of the substrate. Exemplary HDI tape substrates may have, for example, a line pitch of between 16 µm-50 µm.

Flip-chip bonding of a image sensor die utilizes the application of pressure and heat to the back side of the die, which requires that the die be thick enough to withstand the pressure without damage. However, when the image sensor die is wire bonded to the substrate assembly, as described above, pressure and heat need not be applied to the die, thereby enabling a reduction in die thickness.

In addition, the ability to perform numerous steps in the manufacturing process while the substrate assemblies remain in strip array format can enable more efficient batch processing, thereby reducing the cost per unit. Flexible tape substrates may be provided in even larger strips than conventional ceramic and laminate strip arrays, thereby increasing the number of camera modules that may be manufactured in each batch, resulting in an improvement in the manufacturing units per hour (UPH).

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another, or may be combined in various ways. All possible combinations and subcombinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. A camera module, comprising:
a flexible substrate comprising a first portion and a second portion, said flexible substrate being folded at a junction between the first portion and the second portion such that the second portion defines a plane substantially orthogonal to a plane defined by the first portion;
an image sensor die coupled to the second portion of the flexible substrate, said image sensor die comprising a plurality of die contacts coupled to the flexible substrate;
a lens module comprising a lens housing and at least one lens contained in the lens housing, said lens housing being coupled to the second portion of the flexible substrate;
a gyroscopic sensor coupled to the first portion of the flexible substrate;
an image stabilization logic module coupled to the first portion of the flexible substrate;
a first enclosure coupled to the first portion of the flexible substrate encapsulating the gyroscopic sensor and the image stabilization circuit module.

2. The camera module of claim 1, wherein:
the image sensor die is coupled between the flexible substrate and the lens module; and
the plurality of die contacts are wire bonded to the flexible substrate.

3. The camera module of claim 1, wherein:
the second portion of the flexible substrate comprises a die mounting side, a lens module mounting side opposite the die mounting side, and a sensor opening;
the image sensor die is mounted to the die mounting side of the flexible substrate;
the lens module is coupled to the lens module mounting side and encloses the sensor opening; and
the image sensor die is encapsulated in a second enclosure molded to the die mounting side of the flexible substrate.

4. The camera module of claim 3, wherein:
said flexible substrate further comprises a main board contact region extending from and co-planar with the second portion of the flexible substrate, said main board contact region comprising a plurality of land grid array (LGA) pads electrically coupled to the image sensor die via interconnects in the flexible substrate.

5. A camera assembly, comprising:
a substrate comprising a first portion and a second portion that is non-parallel with the first portion;
a lens module comprising a lens housing coupled to the second portion of the substrate;
an image sensor die coupled to the second portion of the substrate;
a plurality of camera components coupled to the first portion of the substrate that is non-parallel with the first portion; and
a first enclosure coupled to the first portion of the substrate, said first enclosure enclosing the plurality of camera components.

6. The camera assembly of claim 5, wherein:
the first portion of the substrate defines a plane substantially orthogonal to a plane defined by the second portion of the substrate.

7. The camera assembly of claim 5, wherein:
the substrate comprises a flexible substrate folded at a junction between the first portion and the second portion.

8. The camera assembly of claim 5, wherein the first enclosure comprises a mold compound.

9. The camera assembly of claim 5, wherein:
the image sensor die is coupled to the substrate between the substrate and the lens module and comprises a plurality of die contacts wire bonded to the substrate.

10. The camera assembly of claim 5, wherein:
the second portion of the substrate comprises a first side, a second side opposite the first side, and an opening;
the image sensor die is coupled to the first side of the substrate; and
the lens module is coupled to the second side of the substrate.

11. The camera assembly of claim 10, wherein:
the first portion of the substrate is coupled to a side of the lens housing.

12. The camera assembly of claim 5, wherein:
said substrate further comprises a main board contact region extending from the second portion of the substrate, said main board contact region comprising a plurality of land grid array (LGA) pads electrically coupled to the image sensor die via interconnects in the substrate.

13. The camera assembly of claim 5, wherein the plurality of camera components comprises a gyroscopic sensor and an image stabilization logic module.

14. The camera assembly of claim 13, further comprising:
an actuator for translating one or more of the at least one lens or the image sensor in response to control signals from the image stabilization logic module.

15. A method of forming a camera assembly, comprising:
providing a substrate having a first portion and a second portion;
coupling a plurality of electronic components to the first portion of the substrate;
coupling an image sensor die to the second portion of the substrate;
coupling a first enclosure to the first portion of the substrate to enclose the plurality of electronic components;
attaching a lens module to the second portion of the substrate, said lens module comprising a first side coupled to the second portion of the substrate and a lateral side orthogonal to the first side; and
attaching the first portion of the substrate to the lateral side of the lens module.

16. The method of claim 15, wherein said coupling the first enclosure to the first portion of the substrate comprises forming a transfer mold enclosure on the first portion of the substrate to encapsulate the plurality of electronic components.

17. The method of claim 15, wherein:
said image sensor die is coupled to the second portion of the substrate between the lens module and the second portion of the substrate.

18. The method of claim 15, wherein:
said image sensor die is coupled to the second portion of the substrate opposite the lens module.

19. The method of claim 15, further comprising coupling a second enclosure to the second portion of the substrate to enclose the image sensor die.

20. The method of claim 15, wherein:
said substrate comprises an opening, wherein said image sensor die is exposed through the opening.

21. The method of claim 15, wherein said attaching the first portion of the substrate to the lateral side of the lens module comprises attaching the first portion of the substrate to the lateral side of the lens module with the first enclosure disposed between the first portion of the substrate and the lateral side of the lens module.

* * * * *